(12) United States Patent  (10) Patent No.: US 9,111,978 B2
Mori et al.  (45) Date of Patent: Aug. 18, 2015

(54) SUBSTRATE CARRIER MEASURING JIG, COLLISION PREVENTING JIG, AND COLLISION PREVENTING METHOD USING THE COLLISION PREVENTING JIG

(75) Inventors: Shoichi Mori, Tokyo (JP); Hirofumi Nakamura, Tokyo (JP)

(73) Assignee: HIRATA CORPORATION, Tokyo (JP)

( * ) Notice: Subject to any disclaimer, the term of this patent is extended or adjusted under 35 U.S.C. 154(b) by 951 days.

(21) Appl. No.: 13/259,736

(22) PCT Filed: Apr. 12, 2010

(86) PCT No.: PCT/JP2010/056546
§ 371 (c)(1),
(2), (4) Date: Nov. 18, 2011

(87) PCT Pub. No.: WO2010/119846
PCT Pub. Date: Oct. 21, 2010

(65) Prior Publication Data
US 2012/0118083 A1    May 17, 2012

(30) Foreign Application Priority Data
Apr. 13, 2009    (JP) .................................. 2009-096559

(51) Int. Cl.
*H01L 21/67*    (2006.01)
*H01L 21/68*    (2006.01)

(52) U.S. Cl.
CPC ........ *H01L 21/681* (2013.01); *H01L 21/67259* (2013.01); *H01L 21/67265* (2013.01)

(58) Field of Classification Search
CPC .................................................. H01L 21/67259
USPC .......................................................... 702/166
See application file for complete search history.

(56) References Cited

U.S. PATENT DOCUMENTS

| 7,596,456 B2 * | 9/2009 | Mollenkopf et al. ............ 702/34 |
| 2007/0018469 A1 * | 1/2007 | Gershenzon et al. ...... 294/103.1 |
| 2007/0151897 A1 * | 7/2007 | Nakayama et al. ........... 206/711 |

* cited by examiner

*Primary Examiner* — Bryan Bui
(74) *Attorney, Agent, or Firm* — Bacon & Thomas, PLLC

(57) ABSTRACT

A wafer carrier measuring jig includes a base member having a carrier placement section where three kinematic pins are disposed in correspondence with three V-shaped grooves provided on the bottom surface of a wafer carrier having a pair of slot sections where wafers are accommodated. Sensors are provided for measuring height from a predetermined reference value, slot pitch, and slot horizontality with respect to at least some slots in the two slot sections. The obtained data of the slot horizontality and the slot heights of each slot section is written into ID information storage.

34 Claims, 18 Drawing Sheets

SUBSTRATE CARRIER MEASURING JIG, COLLISION PREVENTING JIG, AND COLLISION PREVENTING METHOD USING THE COLLISION PREVENTING JIG

TECHNICAL FIELD

The present invention relates to a substrate carrier measuring jig, a collision preventing jig, and a collision preventing method using the collision preventing jig, and more particularly, to a collision preventing jig for preventing a robot from colliding with a wafer when the robot handles the wafer after a FOUP which accommodates wafers of 300 mm or greater therein is placed on a load port, as well as to a collision preventing method using the collision preventing jig.

BACKGROUND ART

At present, when a FOUP which accommodates 300 mm wafers therein is placed on a dock plate (a docking table), V-shaped grooves provided on the bottom surface of the FOUP, having an angle of 90°, and assuming a shape resembling the inverted letter V are placed on three respective kinematic pins provided on the dock plate for positioning in the X-, Y-, and Z-directions (kinematic coupling).

Since FOUPs are resin moldings, angular deviation in the V-shape grooves varies. Some V-shape grooves have an angular deviation in excess of ±5°. Meanwhile, the kinematic pins are made of metal. A distal end portion of the kinematic pin; i.e., the distal end portion on which the corresponding V-shaped groove of the FOUP is placed, has its circumference formed into an R portion (a radiused portion) having a large curvature in order to lower contact pressure against two groove walls (two 45° slopes) of the V-shaped groove. Since the R portion of the kinematic pin has a complicated shape, direct measurement of its machining accuracy after machining is very difficult. Thus, under the present circumstances, kinematic pins manufactured by a plurality of manufacturers are used while their true machining accuracies are unknown or while their shape accuracies are inconsistent. Needless to say, variation of kinematic pins exists among different manufacturers. Even in the case of kinematic pins manufactured by the same manufacturer, variation exists among lots. However, there is no means of checking such variation.

Also, FOUPs are manufactured by a plurality of FOUP manufacturers, and load ports are manufactured by a plurality of load port manufacturers. Thus, there exists variation among FOUPs and among load ports stemming from difference in manufacturer. Also, there exists variation in accuracy caused by wear of the V-shaped grooves and the kinematic pins in the course of use over time. Thus, in the case where an arbitrary FOUP is placed on the dock plate of an arbitrary load port through kinematic coupling, theoretically, kinematic coupling is a positioning method which can ensure accuracy. However, in reality, this positioning method involves such a combination of components as to increase variation in accuracy and thus encounters difficulty in ensuring accuracy with respect to the height direction of the FOUP.

Meanwhile, at present, the standardization of various items associated with a 450 mm wafer is proceeding. The standardization of the slot pitch of a slot section of a FOUP for 450 mm wafers is proceeding on the basis of the same slot pitch of 10 mm as that of a FOUP for 300 mm wafers (even for a slot pitch in excess of 10 mm, standardization is proceeding so as to reduce slot pitch to as small a value as possible). When the 300 mm wafer and the 450 mm wafer have the same wafer thickness, in a state of being placed in a slot, a physical phenomenon of sag of the 450 mm wafer is about three times or more that of the 300 m wafer. Thus, as compared with the FOUP for 300 mm wafers, the FOUP for 450 mm wafers must be positioned with higher accuracy with respect to height; otherwise, a robot becomes highly likely to collide with a wafer accommodated in the FOUP (cracking of a wafer becomes highly likely to occur). Some 300 m and 450 mm wafers are very expensive products; specifically, the price of a product which has undergone the final process reaches tens of millions of yen. Thus, in handling wafers with the robot, the occurrence of such collision may incur a great loss.

The invention described in Patent Document 1 relates to a jig for measuring the position of a wafer in a FOUP, a jig for evaluating the shape of a kinematic pin, and a jig for evaluating the position of a kinematic pin.

PRIOR ART DOCUMENT

Patent Document

Patent Document 1: Japanese Patent No. 3638245

SUMMARY OF THE INVENTION

Problems to be Solved by the Invention

By use of the jigs described in Patent Document 1, when a FOUP is placed on kinematic pins of a load port, there can be measured a wafer position (slot height) of a reference slot in a pair of slot sections (shelf sections), where wafers are accommodated. However, even though the jigs described in Patent Document 1 are used, there remains a problem in that whether or not an arbitrary slot in the paired slot sections is horizontal cannot be determined.

The present invention has been conceived in view of the above circumstances, and an object of the invention is to provide a substrate carrier measuring jig which can measure a substrate carrier for a slot height in a pair of slot sections where substrates are accommodated and which can determine whether or not an arbitrary slot is horizontal, a collision preventing jig, and a collision preventing method using the collision preventing jig.

Means for Solving the Problems

To achieve the above object, an invention according to an aspect of the present invention provides a substrate carrier measuring jig for measuring a slot height of a substrate carrier having a pair of slot sections where substrates are accommodated, comprising: a base member having a carrier placement section where three kinematic pins are disposed in correspondence with three V-shaped grooves provided on a bottom surface of the substrate carrier; measuring means fixedly provided on the base member and having a sensor for measuring height from a predetermined reference value, slot pitch, and slot horizontality with respect to at least some slots in the two slot sections; and write means provided in the carrier placement section of the base member and adapted to write information from the measuring means to an ID information storage means provided in the substrate carrier.

An invention according to another aspect provides a substrate carrier measuring jig for measuring a slot height of a substrate carrier having a pair of slot sections where substrates are accommodated, comprising: a base member having a carrier placement section where three kinematic pins are disposed in correspondence with three V-shaped grooves provided on a bottom surface of the substrate carrier; measuring means fixedly provided on the base member and having a sensor for measuring height from a predetermined reference value, slot pitch, and slot horizontality with respect to at least some slots in the two slot sections; and read-send means provided in the carrier placement section of the base member and adapted to read information from an ID information storage means provided in the substrate carrier and to send information from the measuring means to a host computer.

An invention according to another aspect provides a substrate carrier measuring jig for measuring a slot height of a substrate carrier having a pair of slot sections where substrates are accommodated, the substrate carrier having at least three protrusions and at least two inverted-funnel-shaped cavities on its bottom surface, the protrusions having, at their distal ends, respective flat surfaces defining the same plane, the substrate carrier measuring jig comprising: a base member having a carrier placement section with which the flat surfaces of the protrusions come into contact and in which at least two positioning pins to be fitted respectively into the at least two cavities provided on the bottom surface of the substrate carrier are provided; measuring means fixedly provided on the base member and having a sensor for measuring height from a predetermined reference value, slot pitch, and slot horizontality with respect to at least some slots in the two slot sections; and write means provided in the carrier placement section of the base member and adapted to write information from the measuring means to an ID information storage means provided in the substrate carrier.

An invention according to another aspect provides a substrate carrier measuring jig for measuring a slot height of a substrate carrier having a pair of slot sections where substrates are accommodated, the substrate carrier having at least three protrusions and at least two inverted-funnel-shaped cavities on its bottom surface, the protrusions having, at their distal ends, respective flat surfaces defining the same plane, the substrate carrier measuring jig comprising: a base member having a carrier placement section with which the flat surfaces of the protrusions come into contact and in which at least two positioning pins to be fitted respectively into the at least two cavities provided on the bottom surface of the substrate carrier are provided; measuring means fixedly provided on the base member and having a sensor for measuring height from a predetermined reference value, slot pitch, and slot horizontality with respect to at least some slots in the two slot sections; and read-send means provided in the carrier placement section of the base member and adapted to read information from an ID information storage means provided in the substrate carrier and to send information from the measuring means to a host computer.

An invention according to another aspect provides a substrate carrier measuring jig, further comprising a reference height member provided on the base member in the vicinity of the carrier placement section and adapted to determine the reference value for use in the measuring means.

An invention according to another aspect provides a substrate carrier measuring jig, wherein the measuring means has an elevating mechanism for vertically moving the sensor.

An invention according to another aspect provides a substrate carrier measuring jig, wherein the measuring means has a first measuring sensor for measuring height from the reference value and the slot horizontality with respect to at least some slots in the two slot sections, and a second measuring sensor for measuring the slot pitch with respect to at least some slots in the two slot sections.

An invention according to another aspect provides a substrate carrier measuring jig, further comprising a slide device provided on the base member and adapted to slide the first measuring sensor toward and away from the carrier placement section in a reciprocatory manner.

An invention according to another aspect provides a substrate carrier measuring jig, wherein the first measuring sensor is fixedly provided on the slide device and has at least one sensor support member and two height-horizontality sensors disposed on the sensor support member on a side toward the carrier placement section.

An invention according to another aspect provides a substrate carrier measuring jig, wherein the first measuring sensor is fixedly provided on the slide device and has at least one sensor support member and three height-horizontality sensors which are disposed on the sensor support member on a side toward the carrier placement section at respective positions corresponding to triangle vertices.

An invention according to another aspect provides a substrate carrier measuring jig, wherein the slide device has a slider slidable toward the carrier placement section, and a vertical guide member provided on the slider in a standing condition and horizontally supporting the sensor support member.

An invention according to another aspect provides a substrate carrier measuring jig, further comprising adjustment means for adjusting at least one of a sliding movement of the slide device and an elevating operation of the elevating mechanism.

An invention according to another aspect provides a collision preventing jig for preventing a robot disposed in a minienvironment from colliding with a substrate when the robot unloads the substrate from an arbitrary substrate carrier placed on a dock plate of an arbitrary load port, comprising: an upper jig which, for measuring a slot reference height for the substrate carrier to be placed on the load port and horizontality defined by three kinematic pins provided on the dock plate, is formed of a plate-like member, has three V-shaped grooves disposed on a bottom surface thereof in correspondence with the three kinematic pins, and has at least one displacement sensor on an upper surface thereof for measuring a separation distance, to a horizontal plane of an arbitrary reference height, of a hand of the robot which accesses the vicinity of the upper surface thereof in a reciprocatory manner; and a lower jig which, for measuring a slot height of a substrate carrier having a pair of slot sections where substrates are accommodated, includes a base member having a carrier placement section where three kinematic pins are disposed in correspondence with three V-shaped grooves provided on a bottom surface of the substrate carrier, measuring means fixedly provided on the base member and having a sensor for measuring height from a predetermined reference value, slot pitch, and slot horizontality with respect to at least some slots in the two slot sections, and write means provided in the carrier placement section of the base member and adapted to write information from the measuring means to an ID information storage means provided in the substrate carrier.

An invention according to another aspect provides a collision preventing jig for preventing a robot disposed in a minienvironment from colliding with a substrate when the robot unloads the substrate from an arbitrary substrate carrier placed on a dock plate of an arbitrary load port, comprising: an upper jig which, for measuring a slot reference height for the substrate carrier to be placed on the load port and horizontality defined by three kinematic pins provided on the dock plate, is formed of a plate-like member, has three V-shaped grooves disposed on a bottom surface thereof in correspondence with the three kinematic pins, and has at least one displacement sensor on an upper surface thereof for measuring a separation distance, to a horizontal plane of an arbitrary reference height, of a hand of the robot which accesses the vicinity of the upper surface thereof in a reciprocatory manner; and a lower jig which, for measuring a slot height of a substrate carrier having a pair of slot sections where substrates are accommodated, includes a base member having a carrier placement section where three kinematic pins are disposed in correspondence with three V-shaped grooves provided on a bottom surface of the substrate carrier, measuring means fixedly provided on the base member and having a sensor for measuring height from a predetermined reference value, slot pitch, and slot horizontality with respect to at least some slots in the two slot sections, and read-send means provided in the carrier placement section of the base member and adapted to read information from an ID information storage means provided in the substrate carrier and to send information from the measuring means to a host computer.

An invention according to another aspect provides a collision preventing jig for preventing a robot disposed in a minienvironment from colliding with a substrate when the robot unloads the substrate from an arbitrary substrate carrier placed on a dock plate of an arbitrary load port, comprising: an upper jig which, for measuring a slot reference height for the substrate carrier to be placed on the load port and horizontality of the dock plate, is formed of a plate-like member and has at least one displacement sensor on an upper surface thereof for measuring a separation distance, to a horizontal plane of an arbitrary reference height, of a hand of the robot which accesses the vicinity of the upper surface thereof in a reciprocatory manner; and a lower jig which, for measuring a slot height of a substrate carrier having a pair of slot sections where substrates are accommodated, the substrate carrier having at least three protrusions and at least two inverted-funnel-shaped cavities on its bottom surface, the protrusions having, at their distal ends, respective flat surfaces defining the same plane, includes a base member having a carrier placement section with which the flat surfaces of the protrusions come into contact and in which at least two positioning pins to be fitted respectively into the at least two cavities provided on the bottom surface of the substrate carrier are provided, measuring means fixedly provided on the base member and having a sensor for measuring height from a predetermined reference value, slot pitch, and slot horizontality with respect to at least some slots in the two slot sections, and write means provided in the carrier placement section of the base member and adapted to write information from the measuring means to an ID information storage means provided in the substrate carrier.

An invention according to another aspect provides a collision preventing jig for preventing a robot disposed in a minienvironment from colliding with a substrate when the robot unloads the substrate from an arbitrary substrate carrier placed on a dock plate of an arbitrary load port, comprising: an upper jig which, for measuring a slot reference height for the substrate carrier to be placed on the load port and horizontality of the dock plate, is formed of a plate-like member and has at least one displacement sensor on an upper surface thereof for measuring a separation distance, to a horizontal plane of an arbitrary reference height, of a hand of the robot which accesses the vicinity of the upper surface thereof in a reciprocatory manner; and a lower jig which, for measuring a slot height of a substrate carrier having a pair of slot sections where substrates are accommodated, the substrate carrier having at least three protrusions and at least two inverted-funnel-shaped cavities on its bottom surface, the protrusions having, at their distal ends, respective flat surfaces defining the same plane, includes a base member having a carrier placement section with which the flat surfaces of the protrusions come into contact and in which at least two positioning pins to be fitted respectively into the at least two cavities provided on the bottom surface of the substrate carrier are provided, measuring means fixedly provided on the base member and having a sensor for measuring height from a predetermined reference value, slot pitch, and slot horizontality with respect to at least some slots in the two slot sections, and read-send means provided in the carrier placement section of the base member and adapted to read information from an ID information storage means provided in the substrate carrier and to send information from the measuring means to a host computer.

An invention according to another aspect provides a collision preventing jig, wherein the at least one displacement sensor of the upper jig is disposed on the upper surface of the plate-like member at a position(s) corresponding to the kinematic pins.

An invention according to another aspect provides a collision preventing method using the substrate carrier measuring jig, comprising: step C of placing an arbitrary substrate carrier on the substrate carrier measuring jig and measuring height from a predetermined reference value, slot pitch, and slot horizontality with respect to at least some slots in the two slot sections by means of the measuring means of the substrate carrier measuring jig; step E1 of obtaining the slot horizontality, and slot heights of the two slot sections on the basis of data obtained in the step C and writing the thus-obtained data to the ID information storage means by means of the write means: step F1 of predetermining a reference height of the dock plate in an arbitrary load port, placing, on the dock plate of the load port, the arbitrary substrate carrier which has undergone a data write in the step E1, reading data from the ID information storage means of the substrate carrier in the load port, and sending the predetermined reference height and the data obtained in the step E1 to a host computer: and step G in which the host computer determines an access position of the robot on the basis of the data sent thereto and teaches the robot the access position; on the basis of the teaching data, a substrate being loaded/unloaded between the robot and the arbitrary substrate carrier placed on the arbitrary load port.

An invention according to another aspect provides a collision preventing method using the substrate carrier measuring jig, comprising: step C of placing an arbitrary substrate carrier on the substrate carrier measuring jig and measuring height from a predetermined reference value, slot pitch, and slot horizontality with respect to at least some slots in the two slot sections by means of the measuring means of the substrate carrier measuring jig; step E2 of obtaining the slot horizontality, and slot heights of the two slot sections on the basis of data obtained in the step C and sending the thus-obtained data to a host computer by means of the read-send means; step F2 of placing, on the dock plate of an arbitrary load port, the arbitrary substrate carrier which has undergone a data send in the step E2, reading data from the ID information storage means of the substrate carrier in the load port, and sending ID information of the load port and ID information of the substrate carrier to the host computer; and step G in which the host computer collates the data obtained in the step E2 with a predetermined access reference value for a robot and teaches the robot an access position of the robot; on the basis of the teaching data, a substrate being loaded/unloaded between the robot and the arbitrary substrate carrier placed on the arbitrary load port.

An invention according to another aspect provides a collision preventing method using the collision preventing jig, comprising: step A of placing the upper jig on the dock plate of an arbitrary load port and obtaining a slot reference height for the substrate carrier to be placed on the load port and horizontality defined by the kinematic pins on the basis of separation distances to the horizontal plane measured by means of the three respective displacement sensors; step C of placing an arbitrary substrate carrier on the lower jig and measuring height from a predetermined reference value, slot pitch, and slot horizontality with respect to at least some slots in the two slot sections by means of the measuring means of the lower jig; step E1 of obtaining the slot horizontality, and slot heights of the two slot sections on the basis of data obtained in the step C and writing the thus-obtained data to the ID information storage means by means of the write means; step F1 of placing the arbitrary substrate carrier which has undergone a data write in the step E1, on the dock plate of the arbitrary load port whose data have been obtained in the step A, reading data from the ID information storage means of the substrate carrier in the load port, and sending the data obtained in the step A and the data obtained in the step E1 to a host computer: and step G in which the host computer determines an access position of the robot on the basis of the data sent thereto and teaches the robot the access position; on the basis of the teaching data, a substrate being loaded/unloaded between the robot and the arbitrary substrate carrier placed on the arbitrary load port.

An invention according to another aspect provides a collision preventing method using the collision preventing jig, comprising: step A of placing the upper jig on the dock plate of an arbitrary load port and obtaining a slot reference height for the substrate carrier to be placed on the load port and horizontality defined by the kinematic pins on the basis of separation distances to the horizontal plane measured by means of the three respective displacement sensors; step C of placing an arbitrary substrate carrier on the lower jig and measuring height from a predetermined reference value, slot pitch, and slot horizontality with respect to at least some slots in the two slot sections by means of the measuring means of the lower jig; step E2 of obtaining the slot horizontality, and slot heights of the two slot sections on the basis of data obtained in the step C and sending the thus-obtained data to a host computer by means of the read-send means; step F2 of placing the arbitrary substrate carrier which has undergone a data send in the step E2, on the dock plate of the arbitrary load port whose data have been obtained in the step A, reading data from the ID information storage means of the substrate carrier in the load port, and sending ID information of the load port and ID information of the substrate carrier to the host computer, and step G in which the host computer collates the data obtained in the step E2 with an access reference value for a robot obtained in the step A and teaches the robot an access position of the robot; on the basis of the teaching data, a substrate being loaded/unloaded between the robot and the arbitrary substrate carrier placed on the arbitrary load port.

Effects of the Invention

The present invention yields an excellent effect of providing a substrate carrier measuring jig which can measure an arbitrary substrate carrier for a slot height in a pair of slot sections where substrates are accommodated and which can determine whether or not an arbitrary slot is horizontal.

MODES FOR CARRYING OUT THE INVENTION

Preferred embodiments of the present invention will next be described with reference to the drawings.

Substrate Carrier Measuring Jig

First Embodiment

Figure 1:
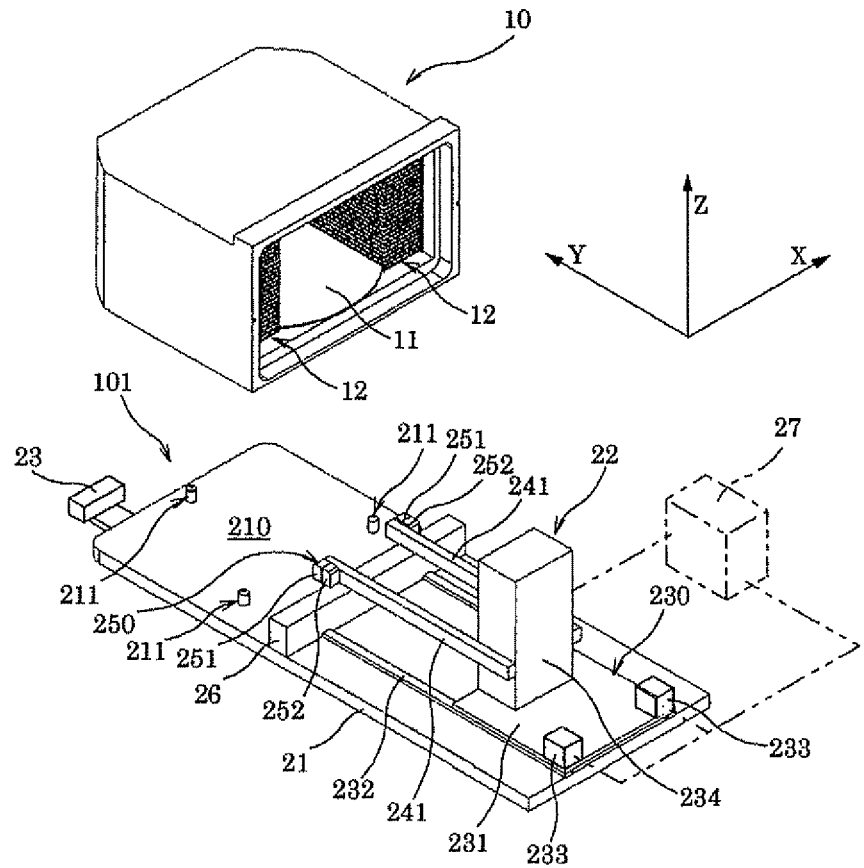
FIG. 1 Perspective view showing a substrate carrier measuring jig according to a first embodiment of the present invention.

FIG. 1 is a perspective view of a substrate carrier measuring jig according to a first embodiment of the present invention.

As shown in FIG. 1, a substrate carrier measuring jig 101 according to the present embodiment is adapted to measure a slot height of a substrate carrier 10 (FIG. 1 shows a FOUP), which has a pair of slot sections 12 where substrates 11 are accommodated and which is placed on the substrate carrier measuring jig 101. The substrate carrier measuring jig 101 includes a base member 21, a measuring means 22, and a write means 23. A dummy wafer, which serves as the substrate 11, is accommodated in a slot at an arbitrary level (in FIG. 1, a slot at the bottom level) of a substrate carrier 10.

The plate-like base member 21 has a carrier placement section 210 which has three kinematic pins 211 disposed in correspondence with three V-shaped grooves (not shown) provided on the bottom surface of the substrate carrier 10. The carrier placement section 210 has the write means 23 provided at a position which faces an ID information storage means (not shown) usually provided on the side of the back surface of the substrate carrier 10 (in FIG. 1, on the upper left side). The write means 23 is adapted to write measured data to the ID information storage means. The write means 23 may have a read function.

The measuring means 22 is provided on the base member 21 and has sensors 250 for measuring height from a predetermined reference value, slot pitch, and slot horizontality with respect to at least some slots in the two slot sections 12. The sensors 250 may be of a type of individually measuring or a type of collectively measuring height from a reference value, slot pitch, and slot horizontality. In FIG. 1, each of the sensors 250 has a first measuring sensor 251 for measuring height from a reference value and slot horizontality with respect to at least a certain slot (at an arbitrary level) (for example, a slot at the bottom level) in the two slot sections 12, and a second measuring sensor 252 for measuring slot pitch with respect to at least some slots (for example, all slots) in the two slot sections 12. Height from a reference value and slot horizontality are measured collectively, whereas slot pitch is measured independently. The first measuring sensors 251 and the second measuring sensors 252 are disposed on sensor support members 241, which will be described later, at their end portions located on a side toward the carrier placement section 210 (end portions opposite supported end portions; hereinafter referred to as distal end portions). The horizontality of a slot at an arbitrary level encompasses the horizontality of the entire substrate carrier 10 and the horizontality of the individual slot.

A slide device 230 is further provided on the base member 21 and is adapted to slide the first and second measuring sensors 251 and 252 toward and away from the carrier placement section 210 in a reciprocatory manner. The slider device 230 has a slider 231, which is slidable relative to the base member 21 and moves toward and away from the carrier placement section 210 in a reciprocatory manner, and a vertical guide member 234, which stands on the slider 231 and horizontally supports the sensor support members 241. A pair of the sensor support members 241 extending in the Y-direction can be moved vertically in the Z-direction by means of an elevating mechanism (not shown) provided within the vertical guide member 234. The slider 231 is driven by drive means 233 provided thereon and slides along a pair of direct-acting guides 232 disposed on the base member 21 along the Y-direction.

The slide device 230 and the elevating mechanism are electrically connected to adjustment means 27 represented by the dash-dot-dot line in FIG. 1, for adjustment of sliding movement and elevating operation. The slider 231 of the slide device 230 may be manually slid by a worker. In this case, the drive means 233 become unnecessary.

A height reference member (height master block) 26 is provided on the base member 21 between the carrier placement section 210 and the two direct-acting guides 232.

For use as the first measuring sensor 251, a sensor which can measure height from a reference height: i.e., height from the upper surface of the height reference member, will suffice. An example of such a sensor is a noncontact-type displacement sensor (laser-based or optical). For use as the second measuring sensor 252, there will suffice a sensor which can detect whether or not a slot exists, or a sensor which can detect a difference between the following distances: the distance between one of adjacent slots and a structural portion (inner wall of FOUP) located between the adjacent slots and the distance between the other one of the adjacent slots and the structural portion. Examples of such a sensor include a photoelectric sensor (reflex type), a proximity sensor (capacitance type), and a displacement sensor (noncontact type). A contact-type sensor may also be usable. Also, a line sensor may be used as the second measuring sensor 252.

Figure 2:
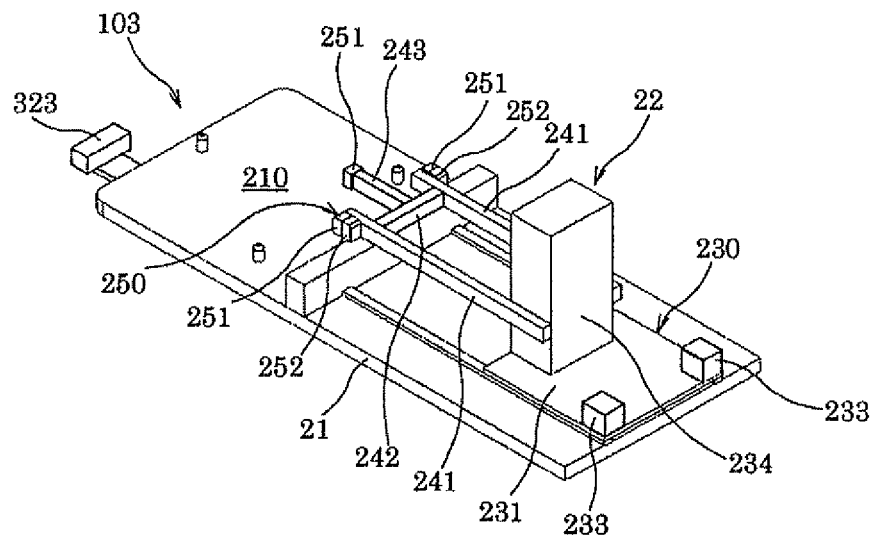
FIG. 2 View showing a modification of FIG. 1.

Also, as shown in FIG. 2, the first measuring sensors 251 may be disposed at three respective positions corresponding to triangle vertices. For example, a connection member 242 is provided in the vicinity of distal end portions of the sensor support members 241 in such a manner that the sensor support members 241 are located on opposite sides of the connection member 242 with respect to the X-direction, for connecting the sensor support members 241 together. A third sensor support member 243 is provided on the connection member 242. The first and second measuring sensors 251 and 252 are disposed on each of the sensor support members 241, which are located on opposite sides of the sensor support member 243 with respect to the X-direction, and only the first measuring sensor 251 is disposed on the sensor support member 243, which is located at the center between the sensor support members 241 with respect to the X-direction.

The substrate carrier measuring jig 101 according to the present embodiment can measure an arbitrary substrate carrier 10 for height from a reference value and slot horizontality with respect to an arbitrary slot by means of the first measuring sensors 251, and for slot pitches with respect to all the slots by means of the second measuring sensors 252.

Also, the substrate carrier measuring jig 101 according to the present embodiment can be used, for example, for inspection of products in a substrate carrier manufacturer and for periodic inspection of substrate carriers in a semiconductor device manufacturer.

The present embodiment has been described while mentioning the case where the FOUP door (not shown) of the substrate carrier (FOUP) 10 is opened. However, the present invention is not limited thereto. For example, the substrate carrier measuring jig 101 may have an opening-closing mechanism (not shown) for opening and closing the FOUP door (not shown). Employment of the opening-closing mechanism eliminates the need to remove the FOUP door of the FOUP. That is, merely by setting the FOUP in the carrier placement section 210 of the substrate carrier measuring jig 101, the FOUP door can be opened and closed, so that a worker does not need to take the trouble to open and close the FOUP door, and the FOUP can be measured fully automatically for height from a reference value, slot pitch, and slot horizontality.

The present embodiment has been described while mentioning the FOUP as the substrate carrier 10. However, the substrate carrier 10 is not limited to the FOUP. The substrate carrier 10 may be a container for accommodating, transporting, or storing the substrates 11, such as an FOSB or an open cassette. The substrate 11 is not limited to a semiconductor wafer, but may be a rectangular panel substrate.

Collision Preventing Jig

Second Embodiment

Figure 11:
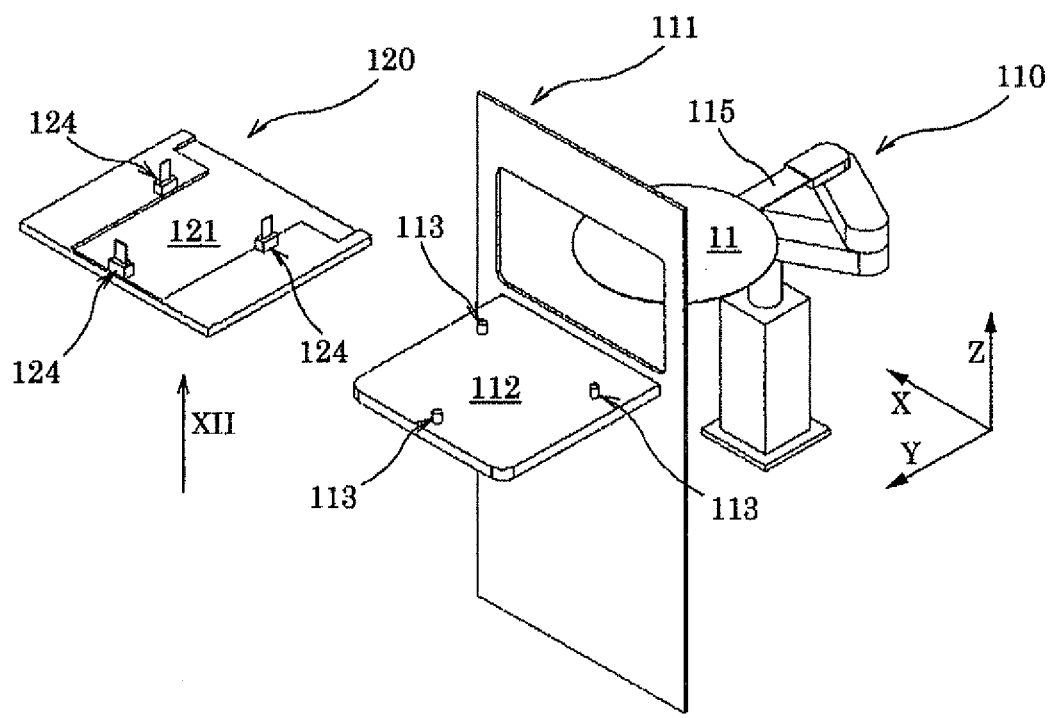
FIG. 11 Perspective view showing an upper jig of a collision preventing jig according to a third embodiment of the present invention.

A collision preventing jig according to a second embodiment of the present invention is a combination of a lower jig implemented by the substrate carrier measuring jig 101 according to the first embodiment shown in FIG. 1, and an upper jig 120 for measuring a slot reference height for a substrate carrier to be placed on a load port 111 shown in FIG. 11 and horizontality defined by three kinematic pins 113 provided on a dock plate 112.

Figure 12:
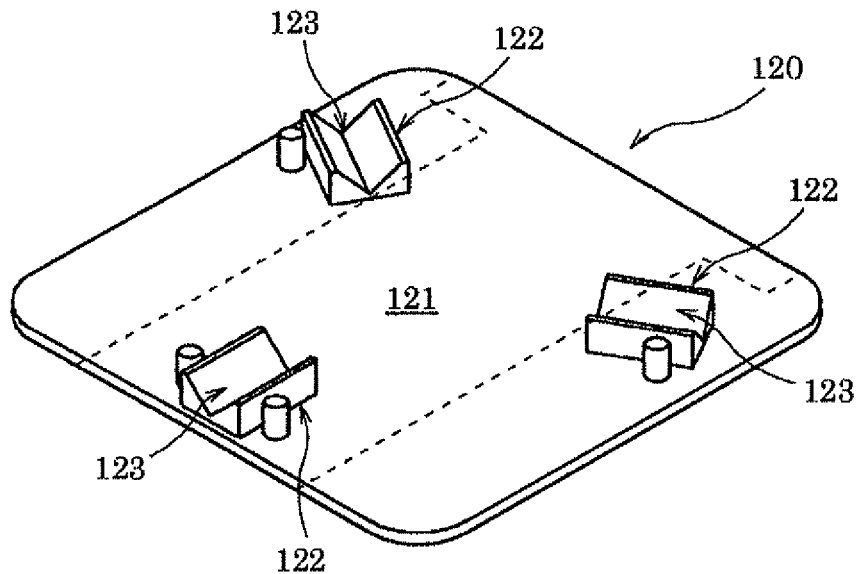
FIG. 12 Perspective view showing the upper jig of FIG. 11 as viewed in the direction of XII of FIG. 11.

The upper jig 120 is formed of a plate-like member 121; has three protrusions 122 having respective V-shaped grooves 123 and disposed on a bottom surface (in FIG. 12, an upper surface) thereof in correspondence with the three kinematic pins 113 of the load port 111; and has at least three (in FIG. 11, three) displacement sensors 124 on an upper surface thereof for measuring respective separation distances to a horizontal plane of an arbitrary reference height of a hand 115 of a robot 110 which accesses the vicinity of the upper surface thereof (see FIG. 11) in a reciprocatory manner. The three displacement sensors 124 are disposed on the upper surface of the plate-like member 121; for example, at respective positions corresponding to the positions of the three kinematic pins 113. Herein, "a horizontal plane of an arbitrary reference height of a hand 115" is the lower surface of a body of the hand 115 or the lower surface of the substrate (dummy wafer) 11 placed on the hand 115.

The collision preventing jig according to the present embodiment can measure an arbitrary FOUP 10 for height from a reference value, slot pitch, and slot horizontality by means of the lower jig 101 and can measure the horizontality of the dock plate 112 of an arbitrary load port 111 by means of the upper jig 120, whereby a reference height of the dock plate can be corrected.

Also, the collision preventing jig according to the present embodiment can be used, for example, to adjust a robot access position, which will be described later, in a semiconductor device manufacturer.

Figure 20:
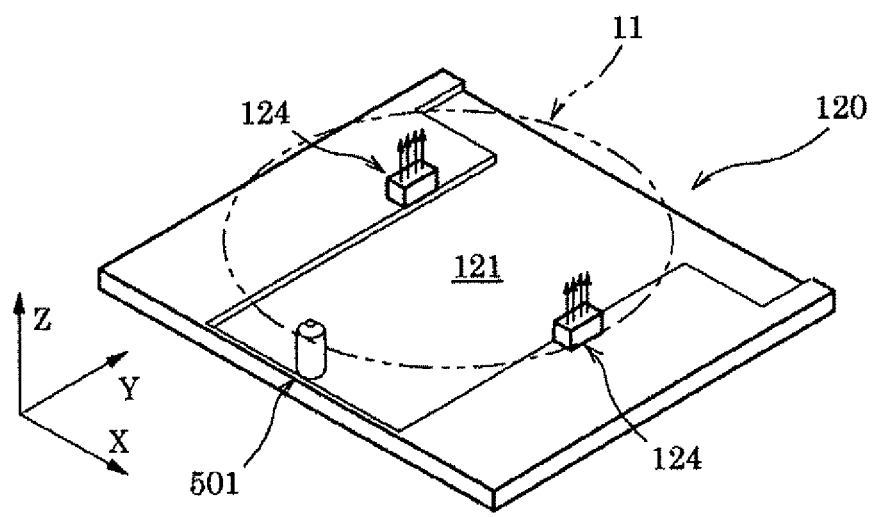
FIG. 20 View showing a modification of the upper jig of FIG. 11.
Figure 21:
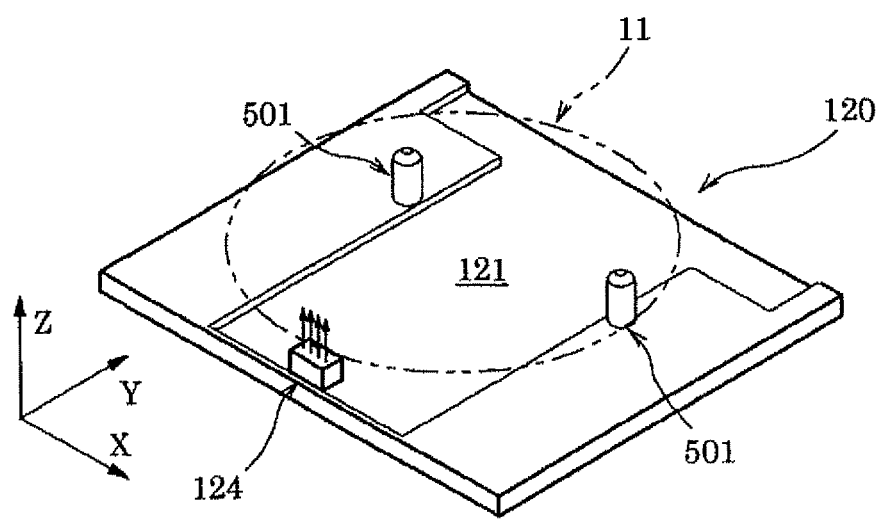
FIG. 21 View showing another modification of the upper jig of FIG. 11.

The present embodiment has been described while mentioning the case where the upper jig 120 has the three displacement sensors 124. However, the present invention is not limited thereto. For example, as shown in FIG. 20, in place of one displacement sensor 124 (in FIG. 20, the displacement sensor located at a lower left position), a positioning pin 501 may be provided. Also, as shown in FIG. 21, in place of two displacement sensors 124 (in FIG. 21, the displacement sensors located at an upper position and at a lower right position), the respective positioning pins 501 may be provided. These positioning pins 501 are provided such that their distal ends come into contact with the back surface of the substrate 11; i.e., their height in the Z-direction is greater than that of the displacement sensor 124. In FIG. 20, by means of the back surface of the substrate 11 being brought into contact with the distal end of the one positioning pin 501, a reference height in the Z-direction is established; thus, by means of the two displacement sensors 124, horizontality with respect to a pitching direction about the X-axis and horizontality with respect to a rolling direction about the Y-axis may be measured. Also, in FIG. 21, by means of the back surface of the substrate 11 being brought into contact with the distal ends of the two positioning pins 501, horizontality with respect to a rolling direction about the Y-axis is established; thus, by means of the one displacement sensor 124, horizontality with respect to a pitching direction about the X-axis may be measured.

Collision Preventing Method

Third Embodiment

A collision preventing method according to a third embodiment of the present invention uses the substrate carrier measuring jig 101 according to the first embodiment.

Figure 15:
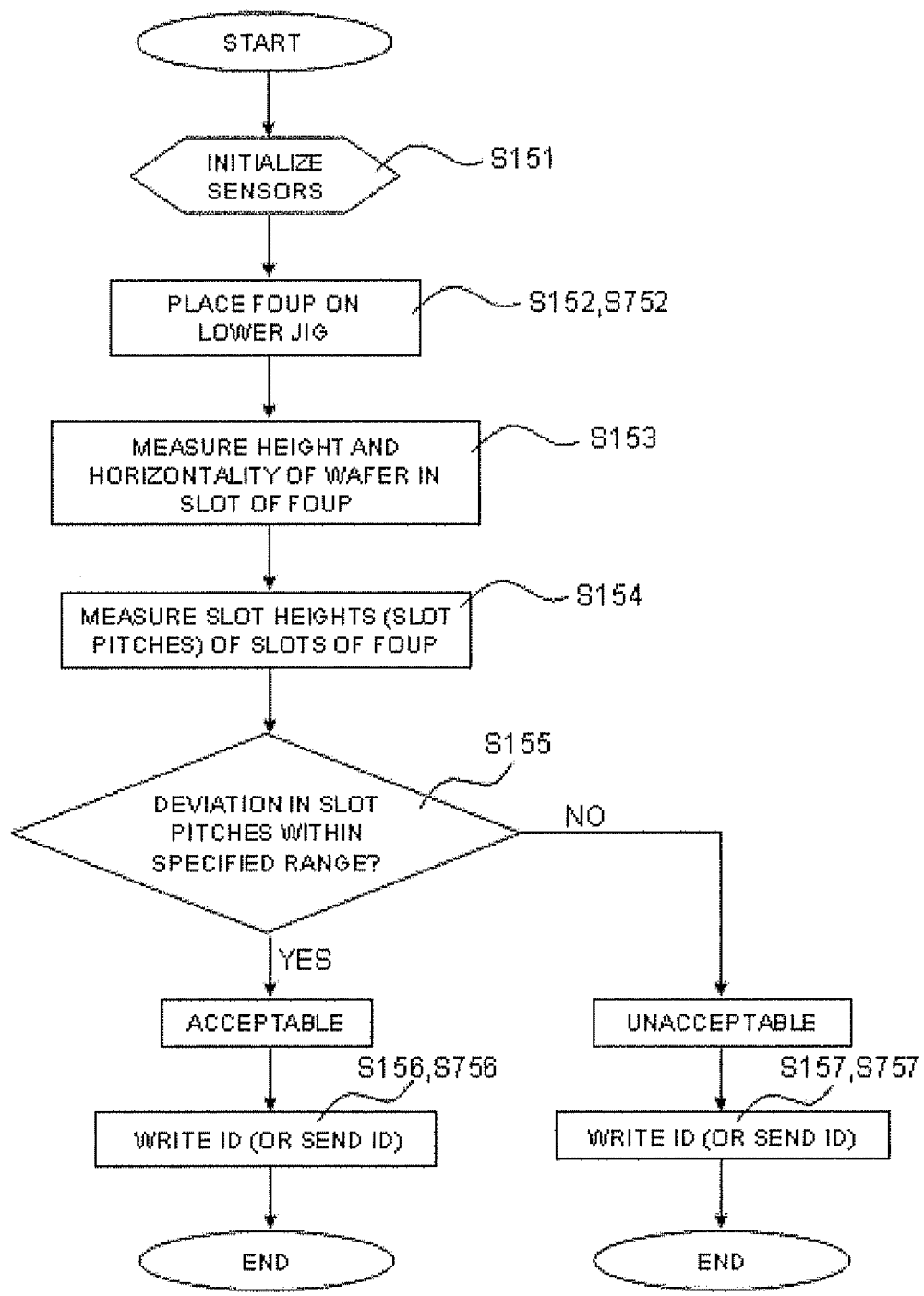
FIG. 15 Flowchart of measurement of the FOUP by use of the substrate carrier measuring jig of FIG. 1.

As shown in FIG. 15, first, the sensors 250 of the substrate carrier measuring jig 101 are initialized (S151). Subsequently, an arbitrary substrate carrier (in FIG. 15, FOUP) 10 is placed on the carrier placement section 210 of the lower jig 101 (see FIG. 3; S152). The substrate (dummy wafer) 11 is accommodated in a slot in an arbitrary level (for example, the slot at the bottom level) of the substrate carrier 10.

Figure 3:
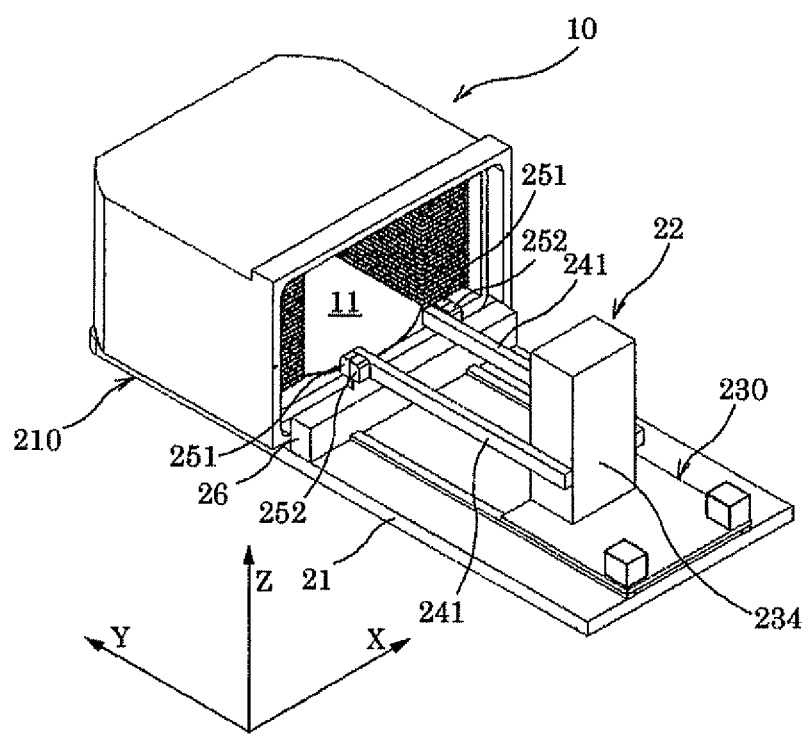
FIG. 3 View showing a state of measurement of a FOUP (adjustment of a datum point of height) by use of the substrate carrier measuring jig of FIG. 1.
Figure 4:
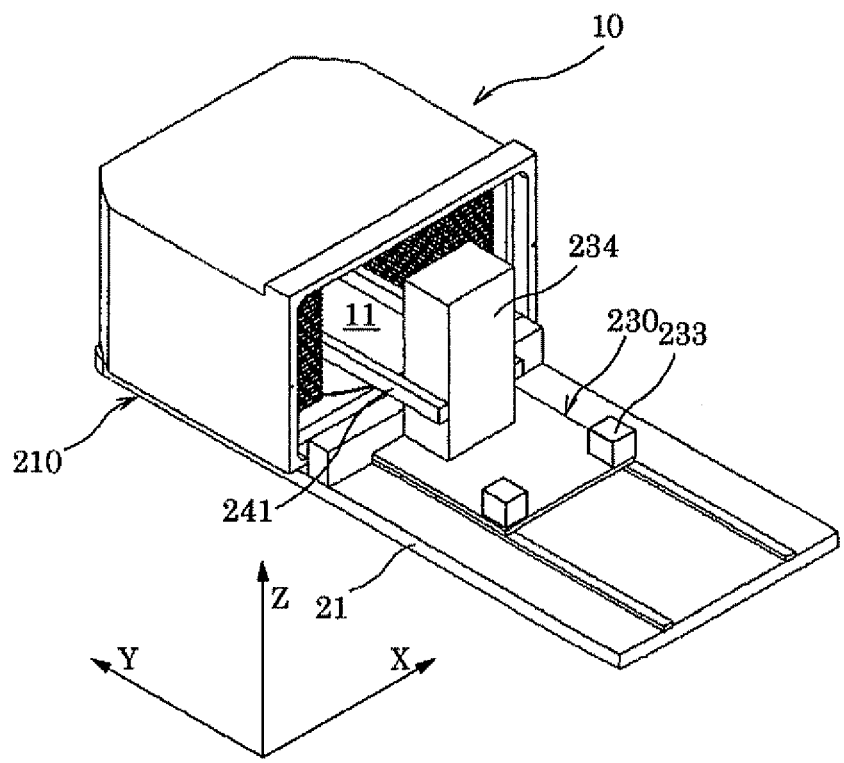
FIG. 4 View showing a state of measurement of the FOUP (measurement of slot horizontality) by use of the substrate carrier measuring jig of FIG. 1.
Figure 19:
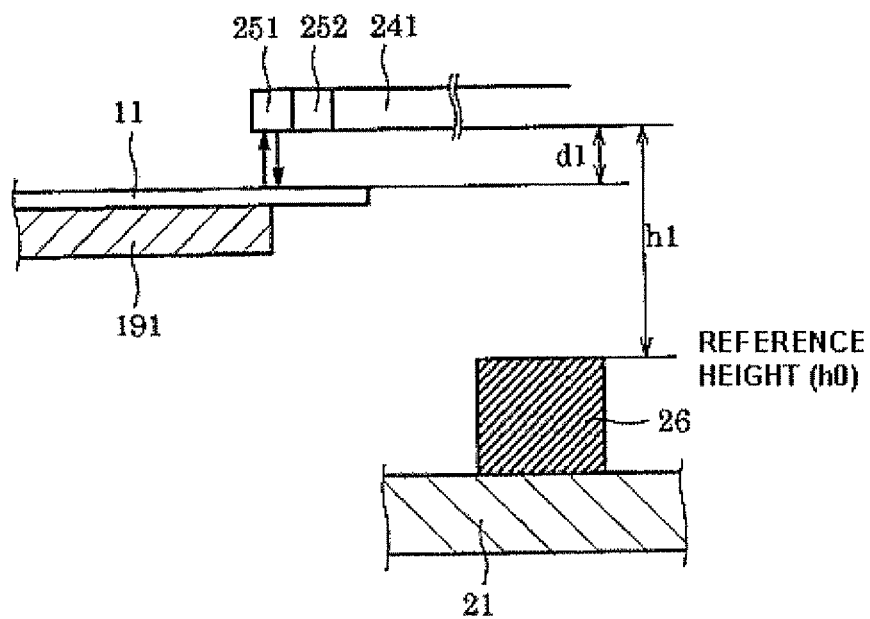
FIG. 19 Schematic view showing measurement of substrate horizontality of a substrate carrier by use of the substrate carrier measuring jig.

Next, as shown in FIG. 3, the elevating mechanism (not shown) of the vertical guide member 234 is adjusted so as to bring the sensor support members 241 into contact with the height reference member (height master block) 26, thereby setting a reference height (zero setting (h0)). Subsequently, the elevating mechanism is adjusted appropriately so as to bring, as shown in FIG. 19, the sensor support members 241 to such an arbitrary height (reference height (h0)+h1) as to not interfere with the substrate 11 accommodated in a slot 191 at the bottom level. Subsequently, as shown in FIG. 4, the slide device 230 is moved forward toward the carrier placement section 210 (in FIG. 4, in the Y-direction) through activation of the drive means 233, thereby gradually inserting the sensors 250 provided on distal end portions of the sensor support members 241 into the substrate carrier 10. In association with this forward movement, the separation distance (d1; see FIG. 19) between the first measuring sensors 251 and the surface of the substrate 11 is scanned and measured, thereby measuring the horizontality of the substrate 11; i.e., the slot horizontality of the bottom level of the substrate carrier 10. On the basis of an arbitrary height (reference height+h1) and the separation distance d1, height from a reference value (reference height+ h1−d1) is obtained; consequently, the slot height of the slot 191 at the bottom level is obtained (S153).

Figure 5:
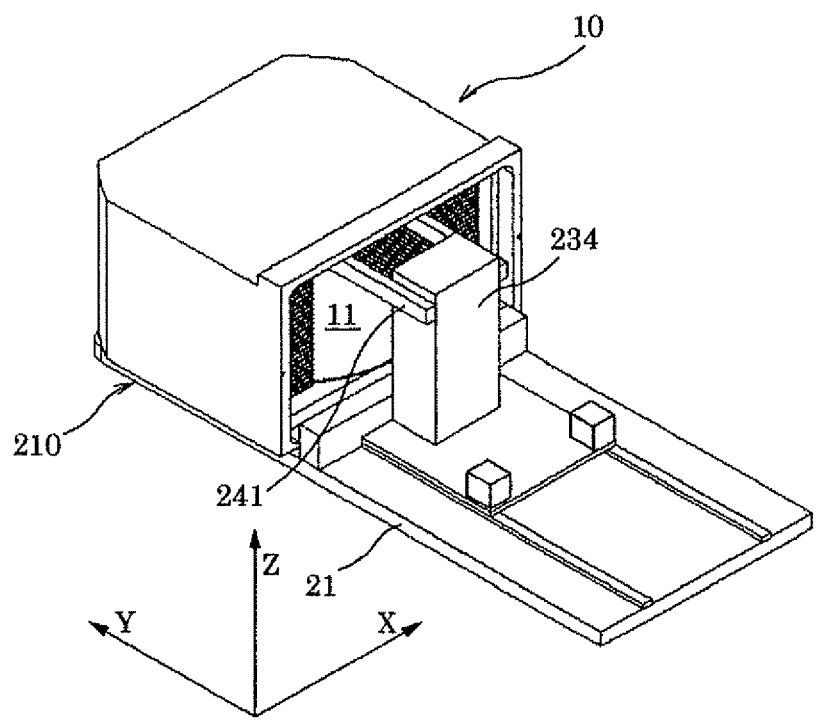
FIG. 5 View showing a state of measurement of the FOUP (measurement of slot height) by use of the substrate carrier measuring jig of FIG. 1.

Next, as shown in FIG. 5, while the sensors 250 provided on the distal end portions of the sensor support members 241 are left inserted in the substrate carrier 10, the elevating mechanism is driven, thereby raising the sensor support members 241 in the Z-direction in FIG. 5. The driving device of the elevating mechanism is, for example, a servomotor. In association with this rising movement, the second measuring sensors 252 detect whether or not slot pieces exist along the Z-direction with respect to at least some slots (in FIG. 5, all slots). In the course of this detection, on the basis of height information derived from servomotor operation and a reference height, slot pitches are obtained (alternatively, all slot positions may be arithmetically obtained, for example, by adding predetermined slot pitches to the slot position (height) of the bottom level; S154).

Through execution of S153 and S154 mentioned above, the substrate carrier 10 is measured for height from a reference value, slot pitch, and slot horizontality for at least some slots of the substrate carrier 10 (step C).

Next, it is judged whether or not deviation in obtained slot pitches falls within a specified range (S155). When it is judged that deviation in the slot pitches falls within the specified range (in the case of YES), the substrate carrier 10 is judged acceptable, and the write means 23 writes data (height from a reference value, slot pitch, and slot horizontality) to the ID information storage means of the substrate carrier 10 (S156). Meanwhile, when it is judged that deviation in the slot pitch(es) fails to fall within the specified range (in the case of NO), the substrate carrier 10 is judged unacceptable, and the write means 23 writes NG data to the ID) information storage means of the substrate carrier 10 (S157). The substrate carrier 10 to which the NG data has been written may suffer partial missing or breakage of structure and thus is repaired or disposed of as appropriate.

Through execution of S156 and S157, the horizontality of the entire substrate carrier 10 and slot heights in the two slot sections are obtained, and the write means 23 writes the obtained data to the ID information storage means (step E1). The data obtained in step E1 are of qualitative measurement by the substrate carrier measuring jig 101 and thus are objective and higher in accuracy as compared with data obtained by a conventional method (data measured by a worker without use of a jig).

Figure 17:
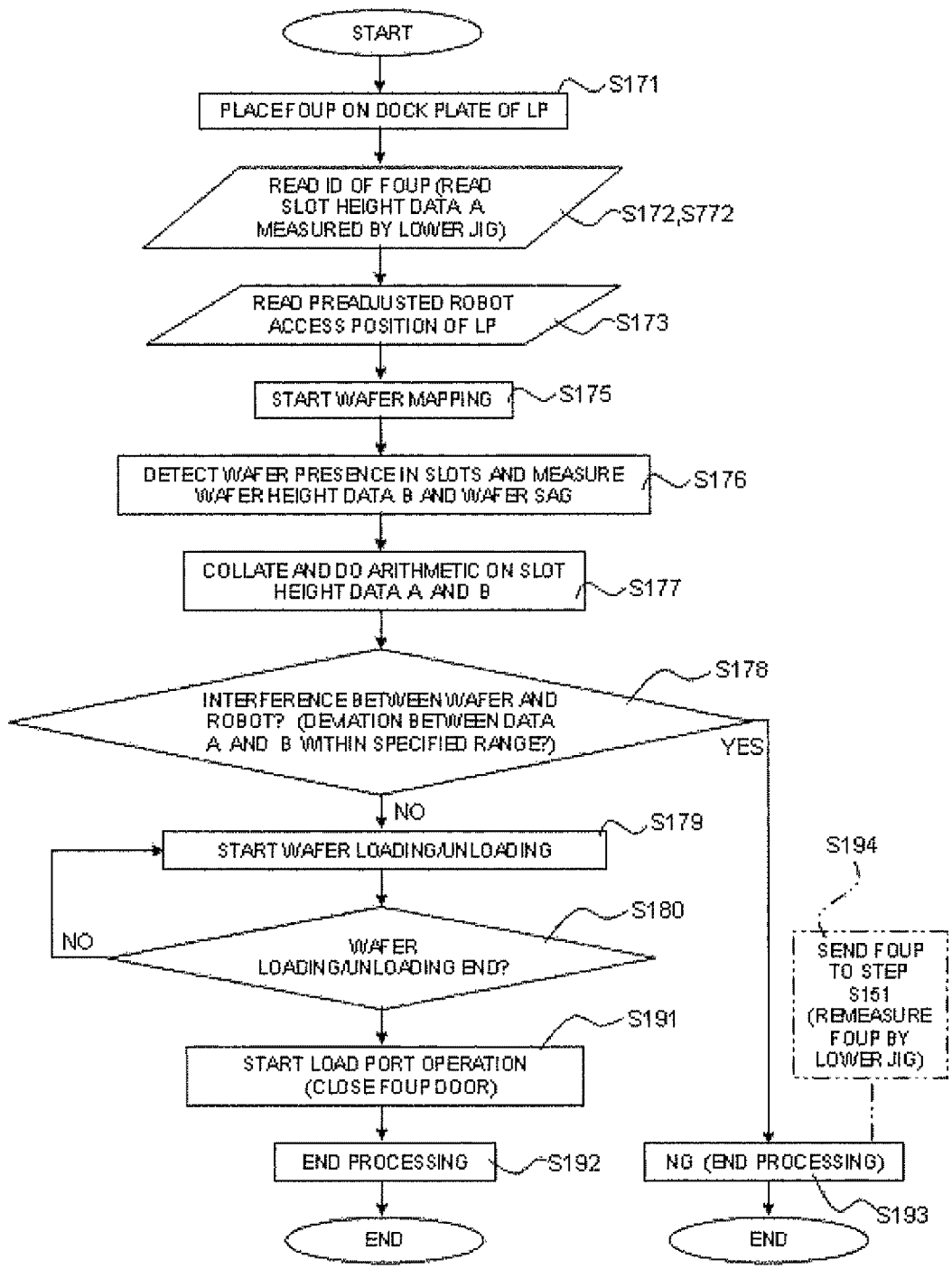
FIG. 17 Flowchart of a collision preventing method using the substrate carrier measuring jig of FIG. 1.

Next, as shown in FIG. 17, the reference height of the dock plate 112 in an arbitrary load port (LP) 111 is predetermined. The arbitrary substrate carrier 10 which has undergone a data write in step E1 is placed on the dock plate 112 of the load port 111 (S171). The expression "the reference height . . . is predetermined" means that the height and horizontality of the load port is adjusted by a conventional method (for example, a worker's manual work without use of a jig) so as to adjust the reference height of the dock plate 112 to a predetermined value.

Next, ID information is read from the ID information storage means of the substrate carrier 10 in the load port 111, thereby reading slot heights (slot height data A) which the substrate carrier measuring jig (lower jig) 101 has measured (S172). The slot height data A obtained in S172, together with ID information of the load port 111, is sent to a host computer (not shown) (step F1).

The host computer retains the preadjusted reference height of the dock plate 112 (an access reference value for the robot 110) tied to ID information of the load port 111. Thus, through reception of the transmitted ID information of the load port 111, the host computer reads the robot access reference value (S173). Subsequent to this read, the host computer collates the slot height data A with the robot access reference value, thereby determining an access position of the robot 110. The host computer teaches the robot 110 the robot access position (step G). Here, the robot access reference value may be employed intact as the robot access position, or the robot access reference value may be readjusted with the slot height data A taken into consideration, for use as the robot access position.

Next, the door of the substrate carrier 10 (for example, FOUP door) in the load port 111 is opened as appropriate; then, by means of a mapping sensor, the mapping of the substrates 11 accommodated in the substrate carrier 10 starts (S175). Through execution of mapping, the existence of substrates in respective slots is detected, and slot pitches (slot height data B of slots determined with the reference height of the dock plate 112 taken into consideration) and sags of substrates are measured (S176). Since the sag of a substrate varies in the course of processing of the substrate (the sag differs between before and after processing), the amounts of sag measured in individual processing steps may be stored in the host computer, and cumulative sag data of preceding steps may be read and added in measurement in the current step.

Next, the slot height data A obtained in S172 and the slot height data B obtained in S176 are collated and undergo arithmetic (S177), whereby it is judged whether or not the substrate 11 and the robot 110 interfere with each other (in other words, whether or not the deviation between data A and B falls within a specified range) (S178).

When it is judged that the substrate 11 and the robot 110 do not interfere with each other (or that the deviation falls within the specified range: in the case of NO), the teaching data (robot access position) in step G is OK; thus, on the basis of the teaching data, the robot 110 loads/unloads the substrate 11; i.e., on the basis of the teaching data, the substrate 11 is loaded/unloaded between the robot 110 and an arbitrary substrate carrier 10 placed on an arbitrary load port 111 (S179). Upon completion of substrate loading/unloading (S180), the door of the substrate carrier 10 is closed as appropriate in the load port 111 (S191), thereby ending the substrate loading/unloading process for the substrate carrier 10 (S192).

When, in step S178, the deviation between data A and B is not such a level as to cause interference, but is rather larger (for example, a slot at an arbitrary level is not horizontal), the hand 115 of the robot 110 shown in FIG. 11 may be pitched (in FIG. 11, rotated about the X-axis) and/or rolled (in FIG. 11, rotated about the Y-axis) as appropriate for fine adjustment of the robot access position. By this operation, interference between the substrate 11 and the hand 115 of the robot 110 can be further reduced. Also, the slot height data A may be overwritten with the slot height data B for generating new slot height data A which reflects current conditions.

Meanwhile, when it is judged that the substrate 11 and the robot 110 interfere with each other (or that the deviation falls outside the specified range: in the case of YES), the substrate carrier 10 is judged NG (substrate processing end) (S193). Since the substrate carrier 10 which has been judged NG (substrate processing end) is conceived, for example, to have wear with time resulting from hundreds or thousands of times of use, the substrate carrier 10 is transmitted as appropriate to the step C; i.e., to a remeasuring step to be carried out by means of the substrate carrier measuring jig 101, wherein new slot height data A is written thereto. In some cases, the substrate carrier 10 is treated as an unacceptable product and thus is repaired or disposed of as appropriate.

According to the collision preventing method of the present embodiment, the slot height data of the substrate carrier 10 which have been qualitatively measured beforehand by means of the substrate carrier measuring jig 101 (nominal data) and the substrate height data of the substrate carrier 10 which have been obtained through mapping (current data) are collated, and sag is taken into consideration; and, at a resultant robot access position (or at a robot access position determined through fine adjustment), the robot 110 is activated. Thus, when the hand 115 of the robot 110 disposed in a minienvironment (not shown) is to unload the substrate 11 from an arbitrary substrate carrier 10 (see FIG. 1) placed on the dock plate 112 of an arbitrary load port 111, there is no risk of interference between the hand 115 and the substrate 11, thereby preventing the hand 115 from colliding with the substrate 11.

As mentioned above, the present embodiment has been described while mentioning the case where current data are obtained through mapping, and the current data are collated with nominal data which have been measured beforehand. However, the present invention is not limited thereto. For example, without obtainment of current data in mapping, the robot 110 may be activated at a robot access position which has been determined on the basis of nominal data only. This eliminates a need to use a servomotor which serves as an elevating mechanism for a mapping sensor, so that an inexpensive cylinder mechanism can be employed. However, in this case, wear with time of the substrate carrier 10 must be periodically inspected so that the nominal data of the substrate carrier 10 become identical with the above-mentioned current data at all times.

Next, other embodiments of the present invention will be described with reference to the appended drawings.

Collision Preventing Method

Fourth Embodiment

A collision preventing method according to a fourth embodiment of the present invention uses data measured by means of the collision preventing jig according to the second embodiment (by means of the substrate carrier measuring jig 101 according to the first embodiment and the upper jig 120).

Figure 16:
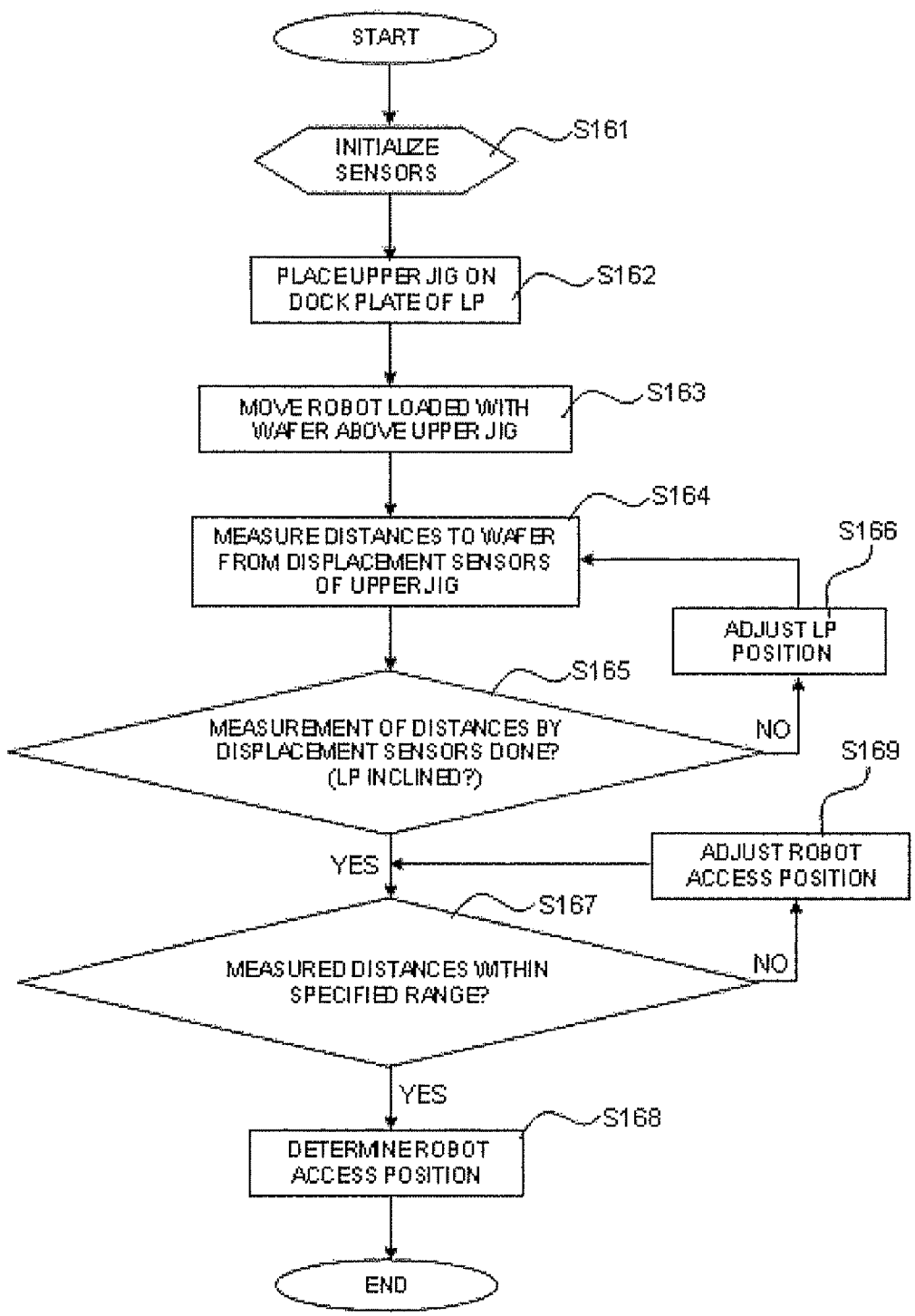
FIG. 16 Flowchart of measurement of the load port by use of the upper jig of FIG. 11.
Figure 18:
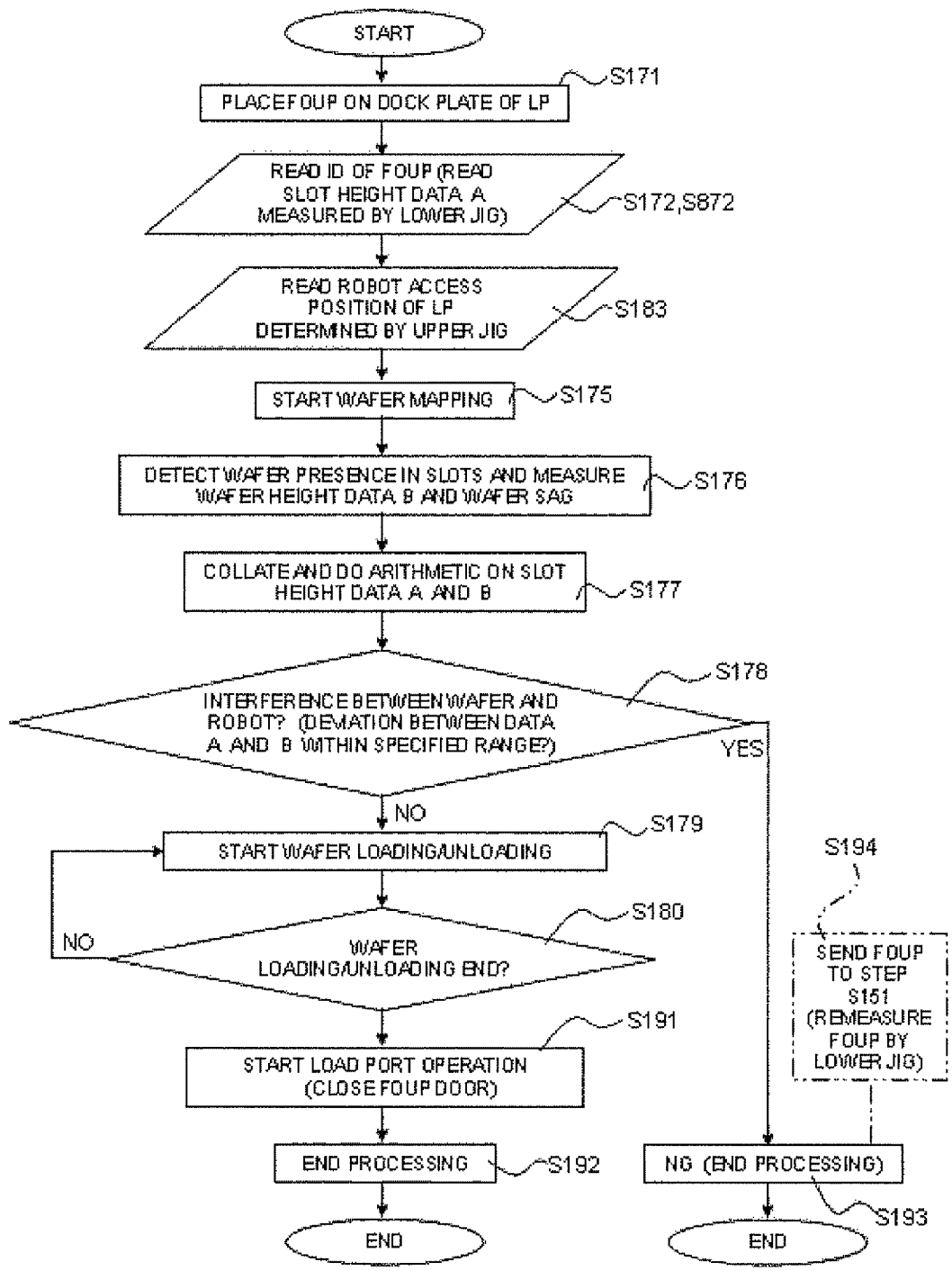
FIG. 18 Flowchart of a collision preventing method using the substrate carrier measuring jig of FIG. 1 and the upper jig of FIG. 11.

The collision preventing method according to the present embodiment differs from the collision preventing method according to the third embodiment in the step of measuring data of the load port 111 by means of the upper jig 120 shown in FIG. 11 and in the step of reading a robot access position of the load port 111. Other steps of the methods are the same. With reference to FIGS. 16 and 18, there are described a step of measuring data of the load port 111 by means of the upper jig 120 and a step of placing the substrate carrier 10 on the dock plate 112 of the load port 111 through a step of reading a robot access position of the load port 11 which has been determined by means of the upper jig 120. Description of other steps is omitted.

Figure 13:
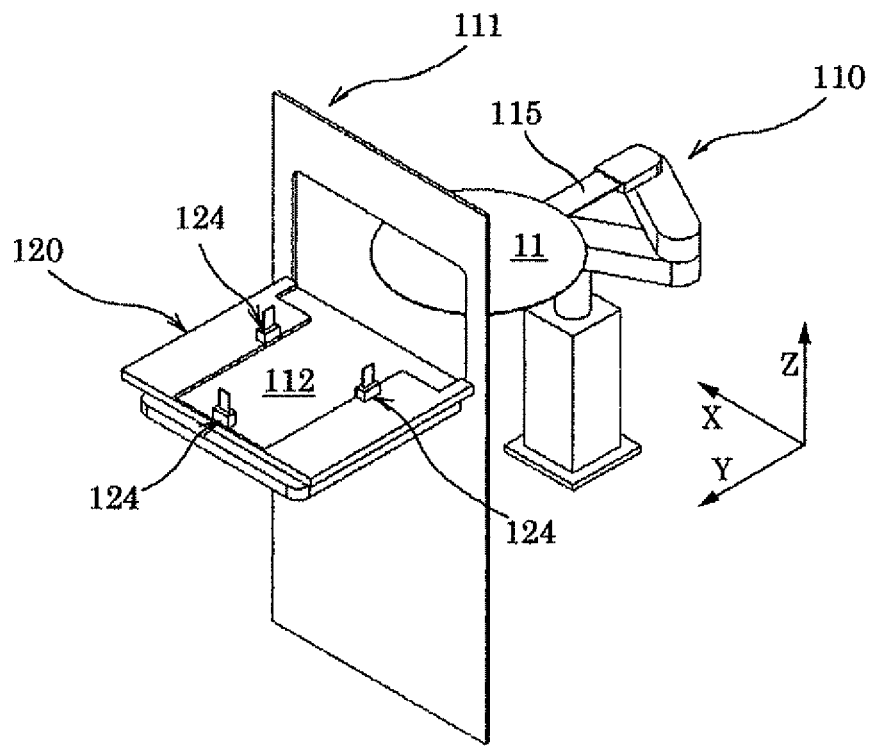
FIG. 13 View showing a state in which an upper jig of a collision preventing jig according to a third embodiment of the present invention is placed on a load port.

As shown in FIG. 16, first, the three displacement sensors 124 of the upper jig 120 (see FIG. 11) are initialized (S161). Subsequently, the upper jig 120 is placed on the dock plate 112 of an arbitrary load port 111 (see FIG. 13; S162).

Figure 14:
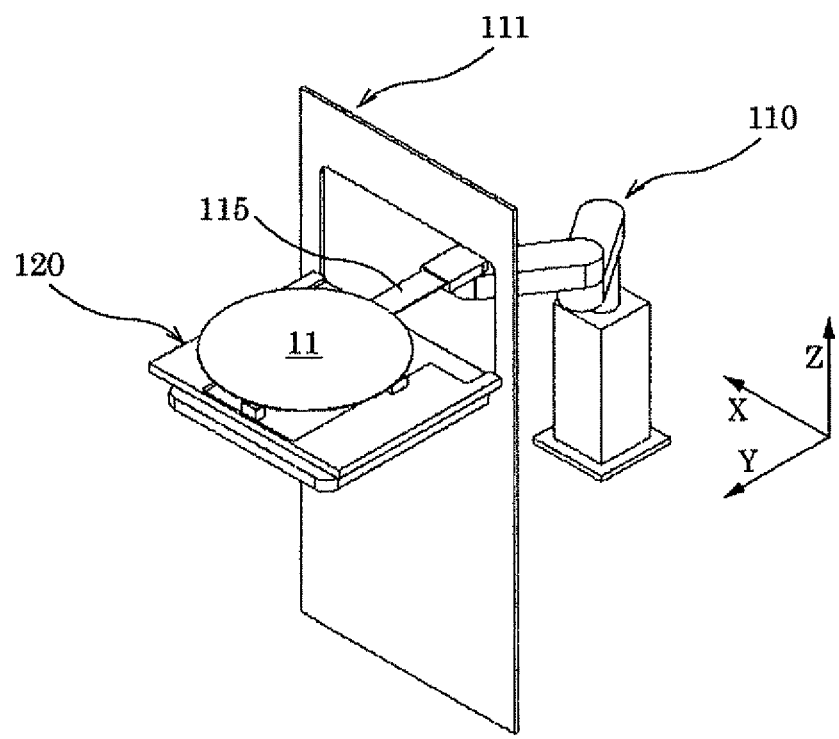
FIG. 14 View showing a state of measurement of a load port (FOUP slot reference height and horizontality defined by all kinematic pins) by use of the upper jig of FIG. 11.

Next, the robot 110 which carries the substrate (dummy wafer) 11 is moved forward above the upper jig 120 (see FIG. 14; S163). In association with this forward movement, the separation distances between the displacement sensors 124 and the lower surface of the substrate 11 are measured (S164). It is judged whether or not the displacement sensors 124 have been able to measure the separation distances; i.e., whether or not the load port 111 is inclined (S165).

When it is judged that the load port 111 is not inclined (in the case of YES), control moves to the next judging step: i.e., to a step of judging whether or not measured distances fall within a specified range (S167). Meanwhile, when it is judged that the load port 111 is inclined (in the case of NO), the position of the load port 111 (or the height of the kinematic pins) is adjusted (S166). Subsequently, control returns to S164 again, and the separation distances are measured.

When it is judged that the measured distances fall within a specified range (in the case of YES), the dock plate 112 and the robot 110 are horizontal (or almost horizontal); thus, the robot access height is obtained on the basis of the measured distances: and, on the basis of the robot access height, the robot access position of the load port 11 is determined (S168). Meanwhile, when it is judged that the measured distances fall outside the specified range (in the case of NO), the horizontality (the robot access position) of the load port 111 is adjusted (S169). Subsequently, control returns to S167 again.

Through execution of S164 to S169 described above, the horizontality of the dock plate 112 (a slot reference height for the substrate carrier 10 to be placed on the load port 111 and horizontality defined by all the kinematic pins) is measured, thereby determining the robot access position (step A).

Next, as shown in FIG. 18, the arbitrary substrate carrier 10 which has undergone a data write in the aforementioned step E1 appearing in the description of the third embodiment is placed on the dock plate 112 of the arbitrary load port (LP) 111 which has undergone measurement of a reference height of the dock plate 112 in the step A (S171).

Next, ID information is read from the ID information storage means of the substrate carrier 10 in the load port 111, thereby reading slot heights (slot height data A) which the substrate carrier measuring jig (lower jig) 101 has measured (S172). The slot height data A obtained in S172, together with ID information of the load port 111, is sent to a host computer (not shown) (step F1).

The host computer retains the robot access position (an access reference value for the robot 110) of the load port 111 which has been determined on the basis of the reference height of the dock plate 112 measured in the step A and which is tied to ID information of the load port 111. Thus, through reception of the transmitted ID information of the load port 111, the host computer reads the robot access reference value (S183). Subsequent to this read, the host computer collates the slot height data A with the robot access reference value, thereby determining an access position of the robot 110. The host computer teaches the robot 110 the robot access position (step G). Here, the robot access reference value may be employed intact as the robot access position, or the robot access reference value may be readjusted with the slot height data A taken into consideration, for use as the robot access position.

According to the collision preventing method of the present embodiment, the slot reference height for the substrate carrier 10 to be placed on an arbitrary load port 111 and horizontality defined by all the kinematic pins are measured qualitatively by means of the upper jig 120. Thus, as compared with the aforementioned collision preventing method according to the third embodiment, the accuracy of the robot access position to be taught to the robot 110 is further improved.

Also, by use of data of an arbitrary load port 111 measured qualitatively by means of the upper jig 120 and data of an arbitrary substrate carrier 10 measured qualitatively by means of the substrate carrier measuring jig 101, when an arbitrary substrate carrier 10 is placed on an arbitrary load port 111, data associated with their combination can be obtained. Specifically, when they are combined, it is known whether their horizontal errors are superposed on each other or cancel each other out. As a result, the robot access position for the case of placement of an arbitrary substrate carrier 10 on an arbitrary load port 111 is obtained with far higher accuracy.

Collision Preventing Jig

Fifth Embodiment

Figure 6:
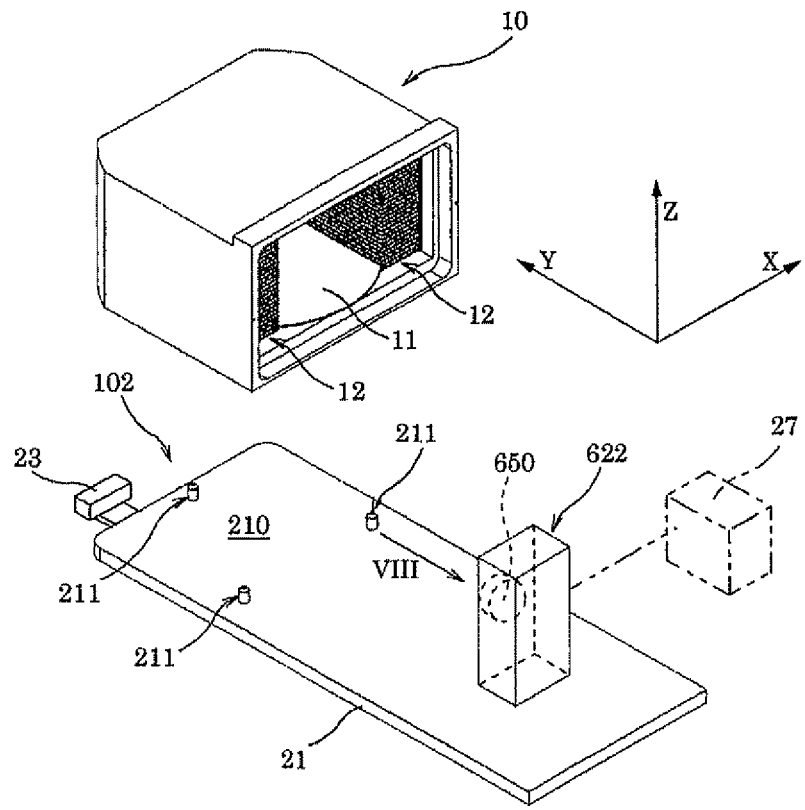
FIG. 6 Perspective view showing a substrate carrier measuring jig according to a second embodiment of the present invention.

The substrate carrier measuring jig 101 according to the first embodiment is configured such that the measuring means 22 has two sensors 250. By contrast, as shown in FIG. 6, a substrate measuring jig 102 according to a fifth embodiment of the present invention includes a measuring means 622 which collectively measures height from a reference value, slot pitch, and slot horizontality by use of a single sensor 650. Other configurational features of the fifth embodiment are similar to those of the first embodiment; thus, repeated description thereof is omitted.

Figure 7:
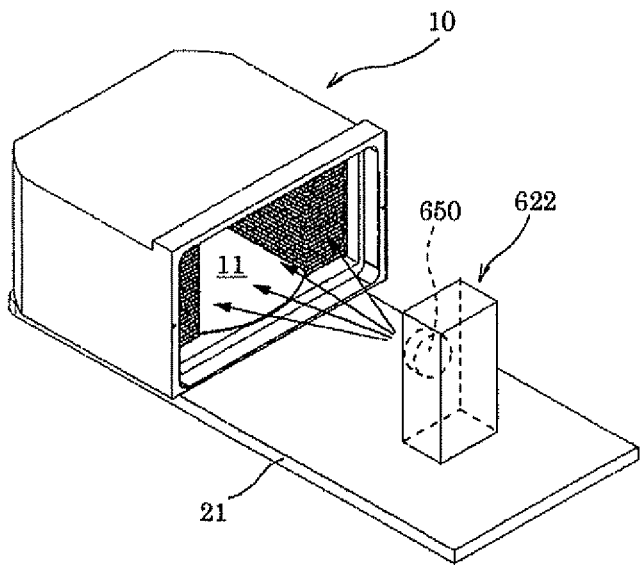
FIG. 7 View showing a state of measurement of the FOUP (measurement of slot horizontality and slot height) by use of the substrate carrier measuring jig of FIG. 6.
Figure 8:
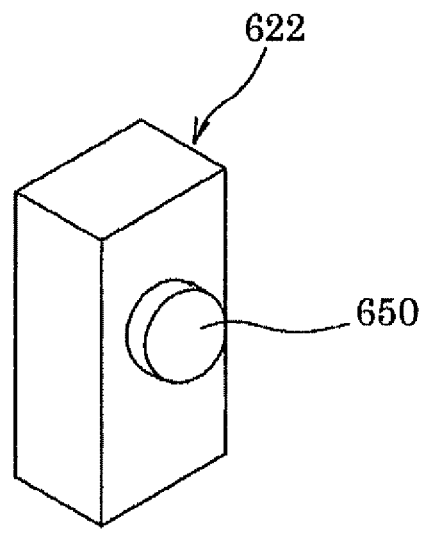
FIG. 8 View showing a measuring means as viewed in the direction of VIII of FIG. 6.
Figure 9:
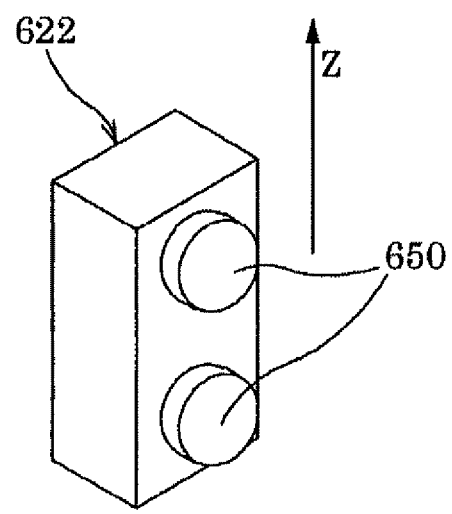
FIG. 9 View showing a modification of FIG. 8.
Figure 10:
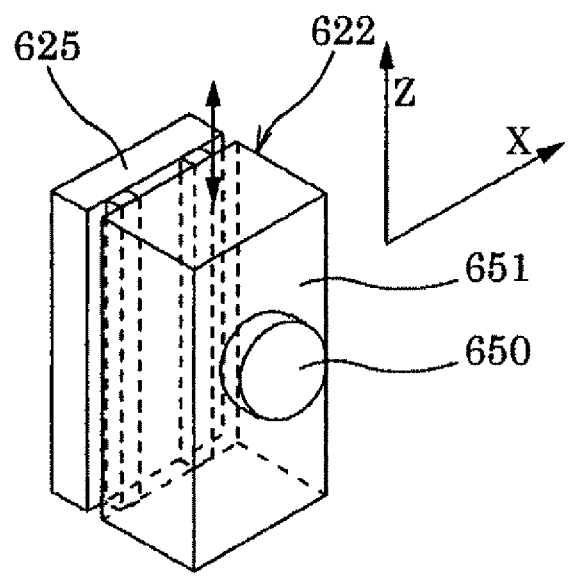
FIG. 10 View showing another modification of FIG. 8.

As shown in FIG. 7, the measuring means 622 has a sensor 650 (see FIG. 8) on a side toward the substrate carrier 10. An example of the sensor 650 is a vision sensor (for example, a CCD camera). As shown in FIG. 8, a single sensor 650 may be disposed or, as shown in FIG. 9, two or more sensors 650 may be disposed in the Z-direction. Also, in place of disposition of a plurality of the sensors 650 in the Z-direction as shown in FIG. 9, as shown in FIG. 10, the measuring means 622 may have an elevating mechanism 625 for vertically moving a support 651 of the sensor 650 in the Z-direction.

The substrate carrier measuring jig 101 according to the first embodiment requires the direct-acting guides 232 and the slide device 230 for sliding the first measuring sensors 251, and the sensor support members 241 for supporting the first and second measuring sensors 251 and 252. However, the present embodiment does not require such configurational features.

According to the present embodiment, the measuring means 622 includes merely a single sensor and does not require the direct-acting guides 232, the slide device 230, and the sensor support members 241; thus, the apparatus configuration is simple and inexpensive. That is, according to the present embodiment, through use of a vision sensor as the sensor 650, the sensor 650 can measure slot horizontality without need of a scanning operation thereof, by means of measuring the right front end height and the left front end height of a slot and the front end height and the rear end height of the slot through image pickup (and focusing as needed). Also, through use of a vision sensor as the sensor 650, the sensor 650 can measure slot heights of individual slots by means of picking up images of all the slots.

Sixth Embodiment

The substrate carrier measuring jig 101 according to the first embodiment includes the base member 21, the measuring means 22, and the write means 23. By contrast, a substrate carrier measuring jig 103 according to a sixth embodiment of the present invention includes, as shown in FIG. 2, a read-send means 323 in place of the write means 23 of the substrate carrier measuring jig 101 according to the first embodiment. Other configurational features of the sixth embodiment are similar to those of the first embodiment; thus, repeated description thereof is omitted.

The read-send means 323 is provided in the carrier placement section 210 of the base member 21 and includes a reader for reading information from the ID information storage means of the substrate carrier 10 and a sender for sending data measured by means of the measuring means 22 to a host computer (not shown).

According to the present embodiment, there is no need to retain the measured data in the ID information storage means of the substrate carrier 10. Thus, an ID information storage means to be used can be small in data storage capacity and thus inexpensive, or of a data write disabled type (such as bar code).

The second embodiment has been described while mentioning the collision preventing jig composed of the substrate carrier measuring jig (lower jig) 101 according to the first embodiment and the upper jig 120. However, the present invention is not limited thereto. As a matter of course, the collision preventing jig may be composed of a lower jig implemented by the substrate carrier measuring jig 102 according to the fifth embodiment and the upper jig 120, or may be composed of a lower jig implemented by the substrate carrier measuring jig 103 according to the sixth embodiment and the upper jig 120.

Collision Preventing Method

Seventh Embodiment

The collision preventing method according to the third embodiment prevents collision by use of data measured by means of the substrate carrier measuring jig 101 according to the first embodiment. By contrast, the collision preventing method according to the present embodiment prevents collision by use of data measured by means of the substrate carrier measuring jig 103 according to the sixth embodiment.

The collision preventing method according to the present embodiment and the collision preventing method according to the third embodiment differ in the steps S152, S156, and S157 shown in FIG. 15, and the steps S172 and S173 shown in FIG. 17 and are identical in other steps. Thus, only the different steps will be described with reference to FIGS. 15 and 17, and repeated description of the other steps will be omitted.

(Steps S151 and S752): As shown in FIG. 15, first, the sensors 150 of the substrate carrier measuring jig 103 are initialized (S151). Subsequently, an arbitrary substrate carrier (in FIG. 15, FOUP) 10 is placed on the carrier placement section 210 of the lower jig 103. At this time, the read-send means 323 (see FIG. 2) roads ID information from the ID information storage means of the substrate carrier 10 (S752). The substrate (dummy wafer) 11 is accommodated in a slot at an arbitrary level (for example, the slot at the bottom level) of the substrate carrier 10.

(Steps S155, S756, and S757): it is judged whether or not deviation in obtained slot pitches falls within a specified range (S155). When it is judged that deviation in the slot pitches falls within the specified range (in the case of YES), the substrate carrier 10 is judged acceptable, and the read-send means 323 sends data (height from a reference value, slot pitch, and slot horizontality) together with the ID information of the substrate carrier 10 to a host computer (S756). Meanwhile, when it is judged that deviation in the slot pitch(es) fails to fall within the specified range (in the case of NO), the substrate carrier 10 is judged unacceptable, and the read-send means 323 sends the NG data together with the ID information of the substrate carrier 10 to the host computer (S757). The substrate carrier 10 to which the NG data has been written may suffer partial missing or breakage of structure and thus is repaired or disposed of as appropriate.

On the basis of the data which have been sent to the host computer in the above-mentioned steps S756 and S757, the horizontality of the entire substrate carrier 10 and slot heights in the two slot sections are obtained, and the obtained data are tied to the ID information and stored (step E2).

(Steps S772 and S173): As shown in FIG. 17, ID information is read from the ID information storage means of the arbitrary substrate carrier 10 in the load port 111 (S772). Also, the robot access position of the load port 111 which has been determined on the basis of a predetermined reference height of the dock plate 112 is read (S173). Subsequently, the ID information read in S772 and the data read in S173 are sent to the host computer (not shown). The host computer reads slot heights (slot height data A) of the substrate carrier 10 tied to the ID information (step F2).

According to the present embodiment, the collision of the hand 115 with the substrate 11 can be prevented for the substrate carrier 10 having the ID information storage means which is of a data read only type and does not have a write function. Other actions and effects yielded by the collision preventing method of the present embodiment are similar to those yielded by the aforementioned collision preventing method according to the third embodiment.

Eighth Embodiment

The collision preventing method according to the seventh embodiment prevents collision by use of data measured by means of only the substrate carrier measuring jig 103 according to the sixth embodiment. By contrast, the collision preventing method according to the present embodiment prevents collision by use of data measured by means of the substrate carrier measuring jig 103 according to the sixth embodiment and the upper jig 120.

The collision preventing method according to the present embodiment and the collision preventing method according to the fourth embodiment differ in the steps S172 and S183 shown in FIG. 18 and are identical in other steps. Thus, only the different steps will be described with reference to FIGS. 15 and 17, and repeated description of the other steps will be omitted.

(Steps S872 and S183): ID information is read from the ID information storage means of an arbitrary substrate carrier 10 in the load port 111 (S872). Also, the robot access position of the load port 111 which has been determined on the basis of the reference height of the dock plate 112 measured in the step A is read (S183). Subsequently, the ID information read in S872 and the data read in S183 are sent to a host computer (not shown). The host computer reads slot heights (the slot height data A measured by means of the substrate carrier measuring jig (lower jig) 103) of the substrate carrier 10 tied to the ID information (step F2).

According to the present embodiment, the collision of the hand 115 with the substrate 11 can be prevented for the substrate carrier 10 having the ID information storage means which is of a data read only type and does not have a write function. Other actions and effects yielded by the collision preventing method of the present embodiment are similar to those yielded by the aforementioned collision preventing method according to the fourth embodiment.

Substrate Carrier Measuring Jig

Ninth Embodiment

The substrate carrier measuring jig 101 according to the first embodiment has the carrier placement section 210 which has the three kinematic pins 211 disposed in correspondence with three V-shaped grooves provided on the bottom surface of the substrate carrier 10.

Figure 24:
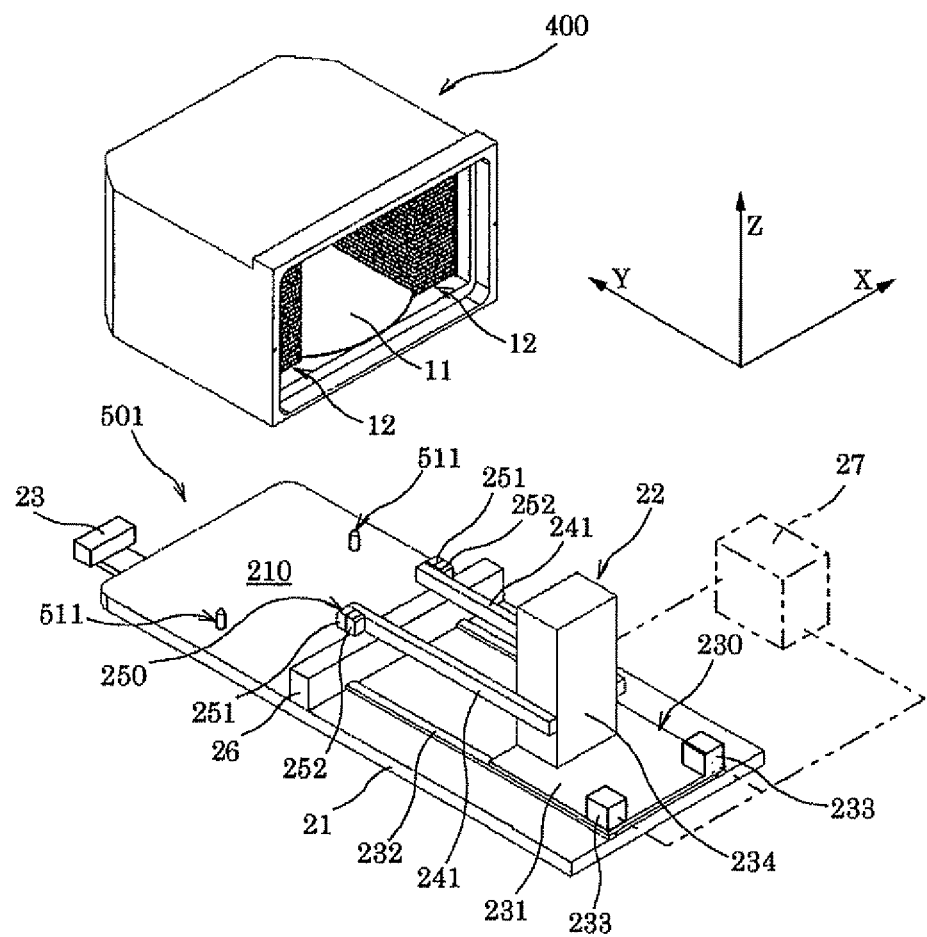
FIG. 24 Perspective view showing the substrate carrier measuring jig according to the ninth embodiment of the present invention.

By contrast, as shown in FIG. 24, a substrate carrier measuring jig 501 according to the present embodiment is for use with a substrate carrier 400 having flat protrusions 402 on its bottom surface 401. The basic configuration of the substrate carrier measuring jig 501 according to the present embodiment is similar to that of the substrate carrier measuring jig 101 according to the first embodiment. Thus, in the following description, repeated detailed description of similar configurational features is omitted, and only different configurational features are described.

Figure 22:
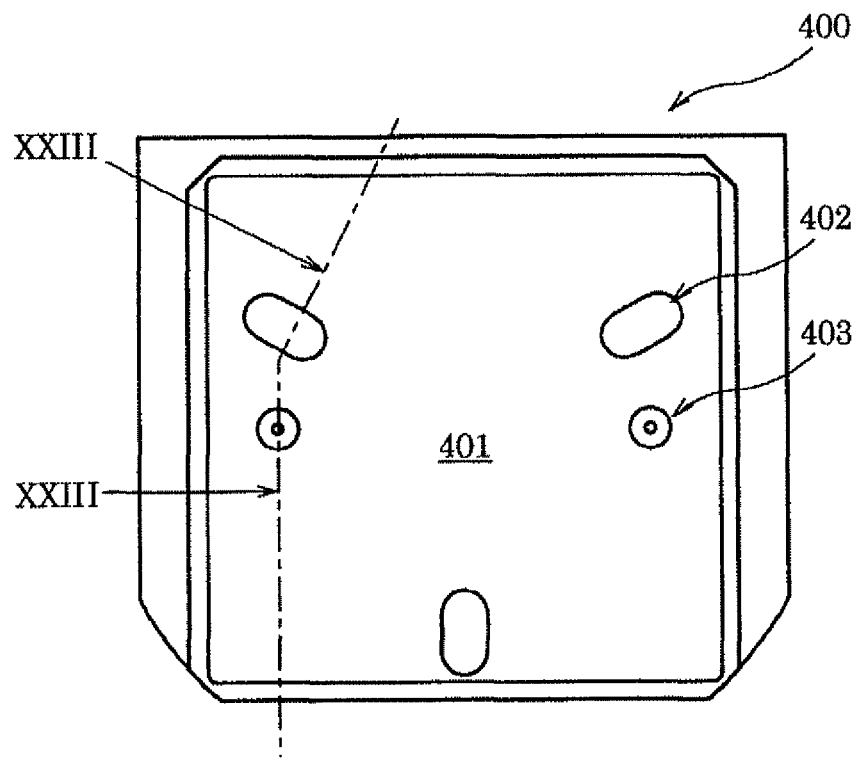
FIG. 22 Bottom view showing a substrate carrier for use with a substrate carrier measuring jig according to a ninth embodiment of the present invention.
Figure 23:
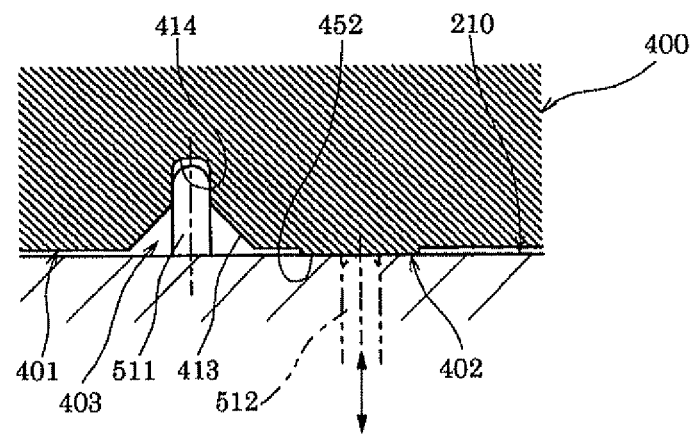
FIG. 23 Sectional view taken along line XXIII-XXIII of FIG. 22.

First, the substrate carrier 400 which the substrate carrier measuring jig 501 according to the present embodiment handles is horizontally placed in position on the carrier placement section 210 of the substrate carrier measuring jig 501 and is adapted to accommodate the substrates 11 therein. As shown in FIGS. 22 and 23, the substrate carrier 400 has, on its bottom surface (bottom of a carrier body) 401, the protrusions (detection pads) 402 whose distal ends have respective flat surfaces 452, and inverted-funnel-shaped cavities (positioning holes) 403. The three protrusions 402 are provided such that their flat surfaces 452 define the same plane. Also, as shown in FIG. 22, the protrusions 402 are provided on the placement section 401 of the substrate carrier 400 in such a positional relation as to correspond to triangle vertices. Also, as shown in FIG. 23, each of the cavities 403 is composed of a tapered pin guide portion 413, which is tapered toward the hole depth (in FIG. 23, toward the upper side), and a pin insertion portion (vertical hole portion) 414, which is formed vertically upward and continuously from the end of the pin guide portion 413 located on a side toward the hole depth.

The substrate carrier measuring jig 501 according to the present embodiment on which the substrate carrier 400 is to be placed has two positioning pins 511 provided in its carrier placement section 210 in such a manner as to project vertically upward from the placement surface of the carrier placement section 210. Also, there may be provided dog sensors (presence detectors) 512 in such a manner as to project above the placement surface and to be retractable below the placement surface.

Positioning between the carrier placement section 210 and the substrate carrier 400 is established through engagement of the positioning pins 511 with the respective cavities 403 and contact between the placement surface of the carrier placement section 210 and the flat surfaces 452 of the protrusions 402. The positioning pins 511 are provided at positions which face the cavities 403. In the case of provision of the dog sensors 512, the dog sensors 512 are provided at positions which face the protrusions 402.

The substrate carrier measuring jig 501 according to the present embodiment can measure an arbitrary substrate carrier 400 for height from a reference value and slot horizontality with respect to an arbitrary slot by means of the first measuring sensors 251, and for slot pitches with respect to all the slots by means of the second measuring sensors 252.

Tenth Embodiment

The substrate carrier measuring jig 501 according to the ninth embodiment includes the base member 21, the measuring means 22, and the write means 23.

Figure 25:
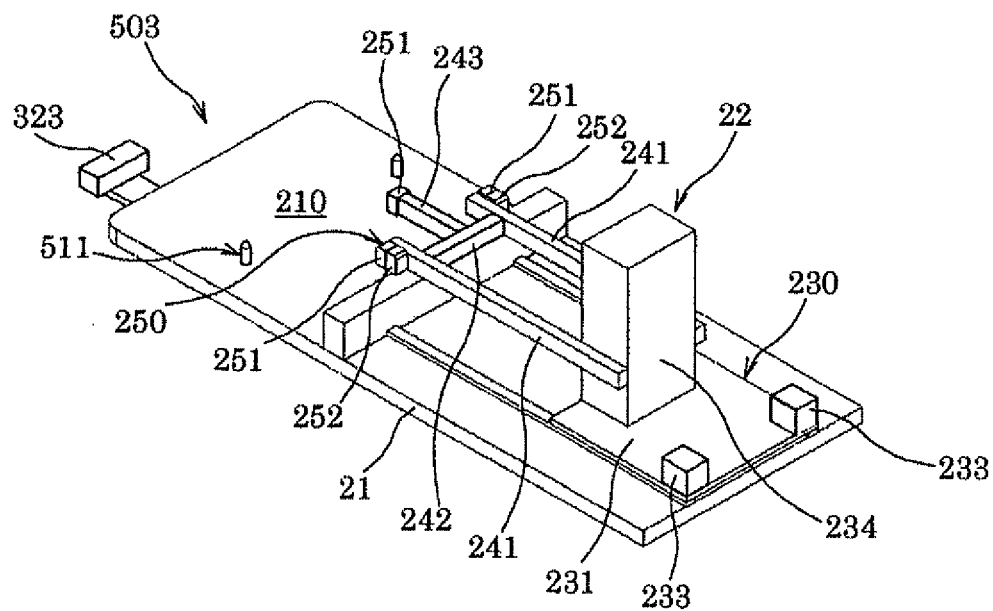
FIG. 25 Perspective view showing a substrate carrier measuring jig according to a tenth embodiment of the present invention.

By contrast, as shown in FIG. 25, a substrate carrier measuring jig 503 according to the present embodiment includes the read-send means 323 of the substrate carrier measuring jig 103 according to the sixth embodiment in place of the write means 23 of the substrate carrier measuring jig 501. The read-send means 323 is described in detail in the description of the sixth embodiment; thus, repeated detailed description thereof is omitted.

According to the present embodiment, there is no need to retain measured data in the ID information storage means of the substrate carrier 400. Thus, an ID information storage means to be used can be small in data storage capacity and thus inexpensive, or of a data write disabled type (such as bar code).

Collision Preventing Jig Eleventh Embodiment A collision preventing jig according to an eleventh embodiment of the present invention is a combination of a lower jig implemented by the substrate carrier measuring jig 501 according to the ninth embodiment shown in FIG. 24, and an upper jig 520 for measuring a slot reference height for a substrate carrier to be placed on the load port 111 shown in FIG. 26 and horizontality of the dock plate 112.

Figure 27:
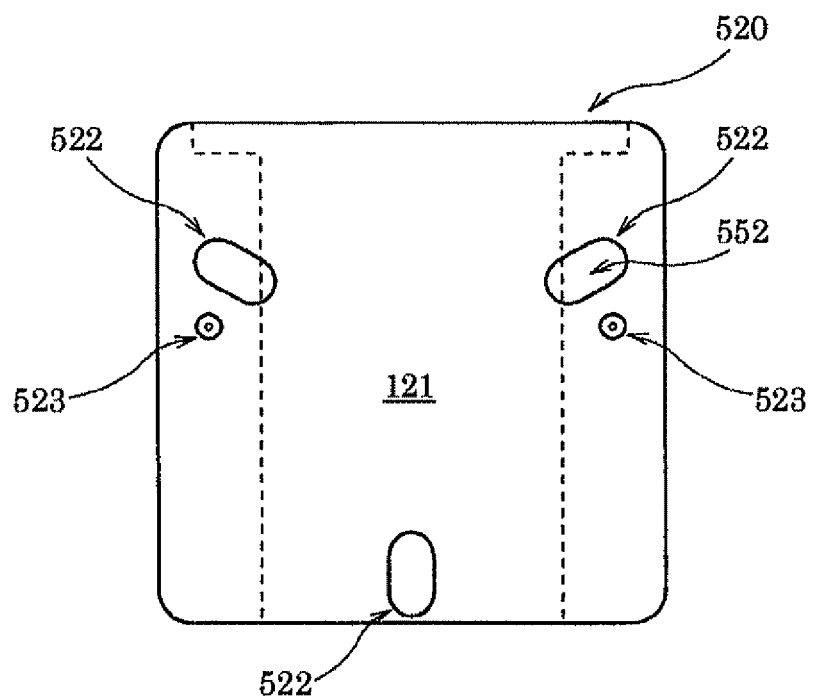
FIG. 27 View showing the upper jig of FIG. 26 as viewed in the direction of XXVII of FIG. 26.

As shown in FIG. 27, the upper jig 520 is formed of the plate-like member 121 and has, on its lower surface, two inverted-funnel-shaped cavities (positioning holes) 523 disposed in correspondence with two positioning pins 513 of the load port 111 and three protrusions (detection pads) 522 each having an oblong cross section and a flat surface 552 at its distal end. The three protrusions 522 are provided such that their flat surfaces 552 define the same plane. The protrusions 522 and the cavities 523 are similar in basic configuration to the protrusions 402 and the cavities 403 shown in FIG. 22; thus, repeated detailed description thereof is omitted.

Figure 26:
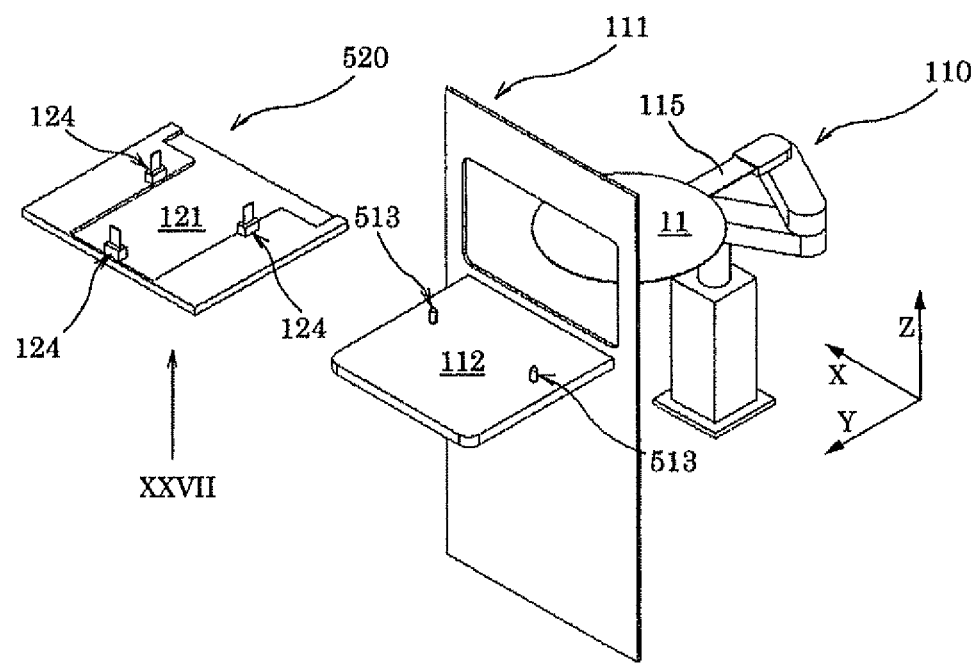
FIG. 26 Perspective view showing an upper jig in a collision preventing jig according to an eleventh embodiment of the present invention.

As shown in FIG. 26, the upper jig 520 has at least three (in FIG. 26, three) displacement sensors 124 on an upper surface thereof for measuring respective separation distances to a horizontal plane of an arbitrary reference height of the hand 115 of the robot 110 which accesses the vicinity of the upper surface thereof in a reciprocatory manner. The three displacement sensors 124 are disposed on the upper surface of the plate-like member 121, for example, at respective positions corresponding to the positions of the three protrusions 522. Herein, "a horizontal plane of an arbitrary reference height of the hand 115" is the lower surface of a body of the hand 115 or the lower surface of the substrate (dummy wafer) 11 placed on the hand 115.

When the upper jig 520 is placed on the dock plate 112, the flat surfaces 552 of the three protrusions 522 which are on the same plane are seated on and come into contact with the dock plate 112. The flat surfaces 552 of the upper jig 520 are in parallel with the lower surface of the upper jig 520. Since the upper jig 520 is formed of the plate-like member 121, parallelism between the upper and lower surfaces thereof can be accurately established with ease; thus, in the upper jig 520, the upper and lower surfaces and the flat surfaces 552 are in parallel with one another. Therefore, by means of the upper jig 520 being placed on the dock plate 112 and the three displacement sensors 124 measuring the respective separation distances to the horizontal plane of an arbitrary reference height of the hand 115 of the robot 110, the degree of inclination (horizontality) of the dock plate 112 with respect to the horizontal plane of an arbitrary reference height can be detected.

In the case of use of a 450 nmm wafer as the substrate 11 and a 450 mm FOUP as the substrate carrier 400, the accuracy of horizontality of the dock plate 112 in the load port 111 becomes very significant in contrast to the case of use of a 300 mm wafer and a 300 mm FOUP, in which case the accuracy of the horizontality has not been considered to be so significant.

Conventionally, in installation of the load port 111, the dock plate 1121 undergoes positioning and adjustment of horizontality, and, after installation, the dock plate 112 does not undergo (rarely undergoes) readjustment of horizontality. Since the 450 mm FOUP is considerably heavy as compared with the 300 mm FOUP, repeated loading/unloading of the FOUP onto/from the dock plate 112 may cause variation in horizontality of the dock plate 112. Also, the 450 mm wafer is larger in size and sag than the conventional 300 mm wafer.

Thus, if the horizontality of the dock plate 112 is not accurately established, the robot hand 115 will become likely to collide with a wafer, and, when a wafer is to be loaded into the FOUP, the wafer will become likely to collide with the FOUP. As a result, there is risk of damage to the wafer, potentially resulting in deterioration in yield of wafers, which are very expensive.

Meanwhile, for example, the upper jig 120 of the collision preventing jig according to the second embodiment described above does not exclusively measure the horizontality of the dock plate 112. Specifically, through placement of the upper jig 120 on the three kinematic pins 113 of the dock plate 112, the horizontality of the upper jig 120 is measured by means of the three displacement sensors 124 and the robot hand 115. At this time, variation in the horizontality is derived mostly from the fact that horizontality of a plane (hereinafter, referred to as the horizontal plane) defined by distal end surfaces of the kinematic pins 113 varies in association with wear with time of the pins. However, horizontality measured by means of the upper jig 120 is not exclusively the horizontality of the horizontal plane because of superposition (addition) of dock plate horizontality. That is, the upper jig 120 measures a combined horizontality (superposed horizontality) of the horizontality of the dock plate 112 and the horizontality of the horizontal plane and, in a strict sense, cannot measure exclusively the horizontality of the dock plate 112.

By contrast, when the upper jig 520 of the collision preventing jig according to the present embodiment is placed on the dock plate 112, even though the positioning pins 513 are worn to some extent, such wear can be considered to have almost no effect on positioning of the upper jig 520 in the Z-direction. Additionally, as mentioned above, the upper and lower surfaces of the upper jig 520 are in parallel with each other; thus, through placement of the upper jig 520 on the dock plate 112, the horizontality of the dock plate 112 is reflected intact in the upper surface of the upper jig 520. Thus, by means of the robot hand 115 accessing above the upper jig 520 and the three displacement sensors 124 measuring the respective separation distances to the lower surface of the substrate 11, the inclination of the substrate 11; in other words, the horizontality (inclination) of the dock plate 112 is measured. By means of readjusting the positioning of the load port 111 on the basis of the results of the measurement, the horizontality of the dock plate 112 can be adjusted. Also, in place of adjustment of the horizontality of the dock plate 112, when the substrate 11 is to be loaded into the FOUP, the robot hand 115 may be inclined according to the horizontality of the dock plate 112.

As mentioned above, by use of the upper jig 520, deviation in horizontality of the dock plate 112 can be detected, thereby eliminating the risk of the collision of the robot hand 115 with the substrate 11, and the collision of the substrate 11 with the FOUP when the substrate 11 is to be loaded into the FOUP. As a result, the risk of damage to the substrate 11 is greatly reduced, thereby improving yield of the substrates 11, which are very expensive.

The present embodiment has been described while mentioning the upper jig 520 of the collision preventing jig which has the same bottom surface structure as that of the bottom surface 401 of the substrate carrier 400 shown in FIG. 24. However, the present invention is not limited thereto. For example, the upper jig 520 may have such a flat bottom surface structure that only the cavities 523 are provided without provision of the protrusions 522. Since this further simplifies the structure of the upper jig 520, the machining cost of the upper jig 520 can be reduced, and the collision preventing jig according to the present embodiment can be reduced in cost.

Needless to say, the present invention is not limited to the above-described embodiments, but may be embodied in various other forms.

DESCRIPTION OF REFERENCE NUMERALS

10: FOUP (substrate carrier)
11: substrate
12: slot section
21: base member
22: measuring means
23: write means
101: substrate carrier measuring jig
210: carrier placement section
211: kinematic pin
250: sensor

The invention claimed is:

1. A collision preventing method for preventing a robot from colliding with a substrate during substrate unloading operation by the robot from a substrate carrier placed on a carrier table, comprising steps of:
(a) measuring slot height from a predetermined reference value, slot pitch, and slot horizontality for at least some slots of the substrate carrier having a pair of slot sections where substrates are accommodated by means of measuring means having a sensor,
(b) obtaining the slot horizontality and slot heights of each slot section on the basis of data obtained in step (a), and writing the thus-obtained data of the slot horizontality and the slot heights of each slot section into ID information storage provided on the substrate carrier by means of write means;
(c) predetermining a reference height of the carrier table on which the substrate carrier is to be placed, placing, on the carrier table, the substrate carrier with data stored in its ID information storage in step (b), reading data from the ID information storage by means of the carrier table, and sending the predetermined reference height and the data obtained in step (b) to a host computer by means of the carrier table;
(d) utilizing the host computer, determining an access position of the robot on the basis of the data sent thereto in step (c); and teaching the robot the access position; and
(e) utilizing the robot with the data received in step (d), loading or unloading a substrate to or from the substrate carrier placed on the carrier table.

2. A collision preventing method according to claim 1, wherein the slot height from the reference value, the slot pitch, and the slot horizontality are obtained in step (a) by measurement by a lower jig which includes:
a base member having a carrier placement section where the substrate carrier is placed; and
measuring means fixedly provided on the base member and having a sensor for measuring slot height from a predetermined reference value, slot pitch, and slot horizontality with respect to at least some slots in the two slot sections.

3. A collision preventing method according to claim 2, wherein the writing in step (b) is performed by the lower jig which includes the write means provided in the carrier placement section of the base member and adapted to write information from the measuring means to ID information storage provided in the substrate carrier.

4. A collision preventing method according to claim 2, further comprising a reference height member provided on the base member in the vicinity of the carrier placement section and adapted to determine the reference value for use in the measuring means.

5. A collision preventing method according to claim 2, wherein the measuring means has an elevating mechanism for vertically moving the sensor.

6. A collision preventing method according to claim 2, wherein the measuring means has:
a first measuring sensor for measuring the slot height from the reference value and the slot horizontality with respect to at least some slots in the two slot sections; and
a second measuring sensor for measuring the slot pitch with respect to at least some slots in the two slot sections.

7. A collision preventing method according to claim 6, further comprising a slide device provided on the base member and adapted to slide the first measuring sensor toward and away from the carrier placement section in a reciprocatory manner.

8. A collision preventing method according to claim 7, wherein the first measuring sensor is fixedly provided on the slide device and has at least one sensor support member and two height-horizontality sensors disposed on the sensor support member on a side toward the carrier placement section.

9. A collision preventing method according to claim 7, wherein the first measuring sensor is fixedly provided on the slide device and has at least one sensor support member and three height-horizontality sensors which are disposed on the sensor support member on a side toward the carrier placement section at respective positions corresponding to triangle vertices.

10. A collision preventing method according to claim 1, further comprising:
(f) obtaining a slot reference height for the substrate carrier to be placed on the carrier table and horizontality of the carrier table; and
wherein the reference height of the carrier table predetermined in step (c) is obtained in process of obtaining the slot reference height in step (f).

11. A collision preventing method according to claim 10, wherein the slot reference height for the substrate carrier and the horizontality of the carrier table are obtained in step (f) by measurement by an upper jig which is formed of a plate-like member and has at least one displacement sensor on an upper surface thereof for measuring a separation distance, to a horizontal plane of an arbitrary reference height, of a hand of the robot which accesses the vicinity of the upper surface thereof in a reciprocatory manner.

12. A collision preventing method according to claim 11, wherein the carrier table is a dock plate of a load port, and the upper jig is placed on the dock plate, wherein the slot reference height for the substrate carrier to be placed on the load port and horizontality defined by all kinematic pins are obtained on the basis of separation distances to the horizontal plane measured by three displacement sensors, respectively.

13. A collision preventing method for preventing a robot from colliding with a substrate during substrate unloading operation by the robot from a substrate carrier placed on a carrier table, comprising steps of:
(a) measuring slot height from a predetermined reference value, slot pitch, and slot horizontality for at least some slots of the substrate carrier having a pair of slot sections where substrates are accommodated by means of measuring means having a sensor;

(b) obtaining the slot horizontality, and slot heights of each slot sections on the basis of data obtained for the substrate carrier in step (a), and sending the thus-obtained data of the slot horizontality and the slot heights of each slot section to a host computer by means of read-send means;

(c) placing, on the carrier table, the substrate carrier for which the data has been sent in step (b), reading data from ID information storage of the substrate carrier at the carrier table by means of the carrier table, and sending ID information of the carrier table and ID information of the substrate carrier to the host computer by means of the carrier table; and (d) utilizing the host computer, collating the data obtained in step (b) with a predetermined access reference value for a robot to determine an access position of the robot, and teaching the robot the determined access position; and (e) utilizing the robot at the access position, loading or unloading a substrate to or from the substrate carrier placed on the carrier table.

14. A collision preventing method according to claim 13, further comprising:

(f) obtaining a slot reference height for the substrate carrier to be placed on the carrier table and horizontality of the carrier table; and wherein the predetermined access reference value for the robot in step (d) is obtained in process of obtaining the slot reference height in step (f).

15. A collision preventing method according to claim 14, wherein the slot reference height for the substrate carrier and the horizontality of the carrier table are obtained in step (f) by measurement by an upper jig which is formed of a plate-like member and has at least one displacement sensor on an upper surface thereof for measuring a separation distance, to a horizontal plane of an arbitrary reference height, of a hand of the robot which accesses the vicinity of the upper surface thereof in a reciprocatory manner.

16. A collision preventing method according to claim 15, wherein the carrier table is a dock plate of a load port, and the upper jig is placed on the dock plate, wherein the slot reference height for the substrate carrier to be placed on the load port and horizontality defined by all kinematic pins are obtained on the basis of separation distances to the horizontal plane measured by three displacement sensors, respectively.

17. A collision preventing method according to claim 1, wherein the slot height from the reference value, the slot pitch, and the slot horizontality are obtained in step (a) by measurement by a lower jig which includes:

a base member having a carrier placement section where the substrate carrier is placed; and measuring means fixedly provided on the base member and having a sensor for measuring slot height from a predetermined reference value, slot pitch, and slot horizontality with respect to at least some slots in the two slot sections.

18. A collision preventing method according to claim 17, wherein the sending in step (b) is performed by the lower jig which includes the read-send means provided in the carrier placement section of the base member and adapted to read information from ID information storage provided in the substrate carrier and to send information from the measuring means to a host computer.

19. A collision preventing method according to claim 17, further comprising a reference height member provided on the base member in the vicinity of the carrier placement section and adapted to determine the reference value for use in the measuring means.

20. A collision preventing method according to claim 17, wherein the measuring means has an elevating mechanism for vertically moving the sensor.

21. A collision preventing method according to claim 17, wherein the measuring means has:

a first measuring sensor for measuring the slot height from the reference value and the slot horizontality with respect to at least some slots in the two slot sections; and a second measuring sensor for measuring the slot pitch with respect to at least some slots in the two slot sections.

22. A collision preventing method according to claim 21, further comprising a slide device provided on the base member and adapted to slide the first measuring sensor toward and away from the carrier placement section in a reciprocatory manner.

23. A collision preventing method according to claim 22, wherein the first measuring sensor is fixedly provided on the slide device and has at least one sensor support member and two height-horizontality sensors disposed on the sensor support member on a side toward the carrier placement section.

24. A collision preventing method according to claim 22, wherein the first measuring sensor is fixedly provided on the slide device and has at least one sensor support member and three height-horizontality sensors which are disposed on the sensor support member on a side toward the carrier placement section at respective positions corresponding to triangle vertices.

25. A collision preventing jig for preventing a robot from colliding with a substrate during substrate unloading operation by the robot from a substrate carrier placed on a carrier table, comprising:

an upper jig for measuring a slot reference height for the substrate carrier to be placed on the carrier table and horizontality of the carrier table, the upper jig including a plate-like member, at least one displacement sensor on an upper surface thereof for individually measuring a separation distance, to a horizontal plane of an arbitrary reference height, of a hand of the robot which accesses the vicinity of the upper surface thereof in a reciprocatory manner, and adjustment means for the upper jig for adjusting at least the one displacement sensor; and a lower jig for measuring slot height of a substrate carrier having a pair of slot sections where substrates are accommodated, the lower jig including:

a base member having a carrier placement section on which the substrate carrier is to be placed;

measuring means, provided on the base member and having a sensor, for measuring slot height from a pre-determined reference value, slot pitch, and slot horizontality with respect to at least some slots in the two slot sections;

moving means, provided on the base member, for moving the sensor of the measuring means to the substrate carrier placed on the carrier placement section and for scanning inside of the substrate carrier;

write means, provided in the carrier placement section of the base member, for writing information from the measuring means to ID information storage provided in the substrate carrier; and adjustment means for the lower jig for adjusting measurement by means of the measuring means, movement by means of the moving means and writing by means of the write means.

26. A collision preventing jig according to claim 25, wherein the substrate carrier has at least three protrusions and at least two inverted-funnel-shaped recesses on its bottom surface, the protrusions having, at their distal ends, respective flat surfaces defining the same plane, and wherein the base member has the carrier placement section with which the flat surfaces of the protrusions come into contact and in which at least two positioning pins to be fitted respectively into the at least two recesses provided on the bottom surface of the substrate carrier are provided.

27. A collision preventing jig according to claim 25, wherein the at least one displacement sensor is disposed on the upper surface of the plate-like member at a position corresponding to a pin for positioning the substrate carrier on the carrier table.

28. A collision preventing method using the collision preventing jig according to claim 25, comprising steps of:
(a) placing the upper jig on a dock plate of a load port, and obtaining a slot reference height for the substrate carrier to be placed on the load port and horizontality defined by the kinematic pins on the basis of separation distances to the horizontal plane measured by means of the three respective displacement sensors;
(b) placing a substrate carrier on the lower jig, and measuring slot height from a predetermined reference value, slot pitch, and slot horizontality with respect to at least some slots in the two slot sections by means of the measuring means of the lower jig;
(c) obtaining the slot horizontality and slot heights of each slot section on the basis of data obtained in step (b), and writing the thus-obtained data of the slot horizontality and the slot heights of each slot section into the ID information storage by means of the write means;
(d) placing the substrate carrier, which has received the data written in step (c), on the dock plate of the load port for which data has been obtained in step (a), reading data from the ID information storage of the substrate carrier in the load port, and sending the data obtained in step (a) and the data obtained in step (c) to a host computer,
(e) utilizing the host computer, determining an access position of the robot on the basis of the data sent thereto, and teaching the robot the access position; and
(f) utilizing the robot taught in step (e), loading or unloading a substrate to or from the substrate carrier placed on the load port.

29. A collision preventing jig for preventing a robot from colliding with a substrate during substrate unloading operation by the robot from a substrate carrier placed on a carrier table, comprising:
an upper jig for measuring a slot reference height for the substrate carrier to be placed on the carrier table and horizontality of the carrier table, the upper jig including a plate-like member, at least one displacement sensor on an upper surface thereof for individually measuring a separation distance, to a horizontal plane of an arbitrary reference height, of a hand of the robot which accesses the vicinity of the upper surface thereof in a reciprocatory manner, and adjustment means for the upper jig for adjusting at least the one displacement sensor; and
a lower jig for measuring slot height of a substrate carrier having a pair of slot sections where substrates are accommodated, the lower jig including:
a base member having a carrier placement section on which the substrate carrier is to be placed;
measuring means, provided on the base member and having a sensor, for measuring slot height from a predetermined reference value, slot pitch, and slot horizontality with respect to at least some slots in the two slot sections;
moving means, provided on the base member, for moving the sensor of the measuring means to the substrate carrier placed on the carrier placement section and for scanning inside of the substrate carrier;
read-send means, provided in the carrier placement section of the base member, for reading information from ID information storage provided in the substrate carrier and for sending information from the measuring means to a host computer; and
adjustment means for the lower jig for adjusting measurement by means of the measuring means, movement by means of the moving means and writing by means of the write means.

30. A collision preventing jig according to claim 29 wherein the substrate carrier has at least three protrusions and at least two inverted-funnel-shaped recesses on its bottom surface, the protrusions having, at their distal ends, respective flat surfaces defining the same plane, and wherein the base member has the carrier placement section with which the flat surfaces of the protrusions come into contact and in which at least two positioning pins to be fitted respectively into the at least two recesses provided on the bottom surface of the substrate carrier are provided.

31. A collision preventing jig according to claim 29, wherein the at least one displacement sensor is disposed on the upper surface of the plate-like member at a position corresponding to a pin for positioning the substrate carrier on the carrier table.

32. A collision preventing method using the collision preventing jig according to claim 29, comprising steps of:
(a) placing the upper jig on a dock plate of a load port, and obtaining a slot reference height for the substrate carrier to be placed on the load port and horizontality defined by the kinematic pins on the basis of separation distances to the horizontal plane measured by means of the three respective displacement sensors;
(b) placing a substrate carrier on the lower jig, and measuring slot height from a predetermined reference value, slot pitch, and slot horizontality with respect to at least some slots in the two slot sections by means of the measuring means of the lower jig;
(c) obtaining the slot horizontality and slot heights of each slot section on the basis of data obtained in step (b), and sending the thus-obtained data of the slot horizontality and the slot heights of each slot section to a host computer by means of the read-send means;
(d) placing the substrate carrier, for which data has been sent in step (c), on the dock plate of the load port for which data has been obtained in step (a), reading data from the ID information storage of the substrate carrier in the load port, and sending ID information of the load port and ID information of the substrate carrier to the host computer,
(e) utilizing the host computer, collating the data obtained in step (c) with an access reference value for a robot obtained in process of obtaining the slot reference height in step (a), and teaching the robot an access position of the robot;
(f) utilizing the robot taught in step (e), loading or unloading a substrate to or from the substrate carrier placed on the load port.

33. A collision preventing method using a lower jig, the lower jig comprising:
a base member having a carrier placement section where a substrate carrier is placed;
measuring means, fixedly provided on the base member and having a sensor, for measuring slot height from a predetermined reference value, slot pitch, and slot horizontality with respect to at least some slots in two slot sections of the substrate carrier; and write means, provided in the carrier placement section of the base member, for writing information from the measuring means into ID information storage provided in the substrate carrier, the collision preventing method comprising steps of:

(a) placing the substrate carrier on the lower jig and measuring slot height from the predetermined reference value, slot pitch, and slot horizontality with respect to at least some slots in the two slot sections by means of the measuring means of the lower jig;

(b) obtaining the slot horizontality and slot heights of each slot section on the basis of data obtained in step (a) and writing the thus-obtained data of the slot horizontality and the slot heights of each slot section into the ID information storage by means of the write means of the lower jig;

(c) predetermining a reference height of a dock plate of a load port;

(d) placing, on the dock plate of the load port, the substrate carrier which has received the data written in step (b), reading data from the ID information storage of the substrate carrier in the load port, and sending the predetermined reference height and the data obtained in step (b) to a host computer;

(e) utilizing the host computer, determining an access position of the robot on the basis of the data sent thereto and teaching the robot the access position; and (f) utilizing the robot taught in step (e), loading or unloading a substrate to or from the substrate carrier placed on the load port.

34. A collision preventing method using a lower jig, the lower jig comprising:

a base member having a carrier placement section where a substrate carrier is placed;

measuring means, fixedly provided on the base member and having a sensor, for measuring slot height from a predetermined reference value, slot pitch, and slot horizontality with respect to at least some slots in two slot sections of the substrate carrier; and read-send means, provided in the carrier placement section of the base member, for reading information from ID information storage provided in the substrate carrier and for sending information from the measuring means to a host computer, the collision preventing method comprising steps of:

(a) placing the substrate carrier on the lower jig and measuring slot height from the predetermined reference value, slot pitch, and slot horizontality with respect to at least some slots in the two slot sections by means of the measuring means of the lower jig;

(b) obtaining the slot horizontality and slot heights of each slot section on the basis of data obtained in step (a), and sending the thus-obtained data of the slot horizontality and the slot heights of each slot section to a host computer by means of the read-send means of the lower jig;

(c) placing, on a dock plate of a load port, the substrate carrier for which the data has been sent in step (b), reading data from the ID information storage of the substrate carrier in the load port, and sending ID information of the load port and ID information of the substrate carrier to the host computer, (d) utilizing the host computer, collating the data obtained in step (b) with a predetermined access reference value for a robot and teaching the robot an access position of the robot; and (e) utilizing the robot taught in step (d), loading or unloading a substrate to or from the substrate carrier placed on the load port.

* * * * *